United States Patent [19]

Kawahara et al.

[11] Patent Number: 5,719,529
[45] Date of Patent: Feb. 17, 1998

[54] OPERATIONAL AMPLIFIER AND DIGITAL SIGNAL TRANSFER CIRCUIT

[75] Inventors: Hironori Kawahara; Yukio Ono; Seiichiro Kikuyama, all of Tokyo, Japan

[73] Assignee: Mitsubishi Denki Kabushiki Kaisha, Tokyo, Japan

[21] Appl. No.: 633,356

[22] Filed: Apr. 17, 1996

[51] Int. Cl.[6] .................................................. H03F 3/45
[52] U.S. Cl. ........................ 330/253; 327/89; 327/563; 330/257; 330/260
[58] Field of Search ........................... 330/253, 257, 330/260; 327/81, 85, 89, 561, 562, 563

[56] References Cited

U.S. PATENT DOCUMENTS

| | | | |
|---|---|---|---|
| 4,500,841 | 2/1985 | Morey | 327/85 |
| 4,672,326 | 6/1987 | Cini et al. | 330/260 X |
| 5,196,741 | 3/1993 | Rustici | 327/89 X |
| 5,592,112 | 1/1997 | Nishibe | 327/89 X |

FOREIGN PATENT DOCUMENTS 203305  12/1982  Japan ..................... 330/257

*Primary Examiner*—James B. Mullins
*Attorney, Agent, or Firm*—Leydig, Voit & Mayer, Ltd.

[57] ABSTRACT

An operational amplifier and a digital signal transfer circuit in which an output voltage does not decrease instantly even if an abrupt change of input signal due to noise causes a high-to-low transition to be superposed on an input signal. The operational amplifier includes a differential pair of transistors with a first transistor having a collector that is grounded and a second transistor having an emitter connected to the emitter of the first transistor; a current mirror circuit with a third transistor having a collector connected to an output node of the differential pair of transistors and a fourth transistor having a base connected to a base of the third transistor; a fifth transistor having a collector connected to an output terminal and a base connected to an output node of the current mirror circuit; and a capacitive element connected between the output node of the current mirror circuit and the output terminal.

13 Claims, 16 Drawing Sheets

INPUT

OUTPUT OF
OPERATIONAL
AMPLIFIER 10

OUTPUT OF
COMPARATOR 20

INPUT

OUTPUT OF
CR FILTER $V_{ref}2$ $\Delta t$

OUTPUT (PRIOR ART)

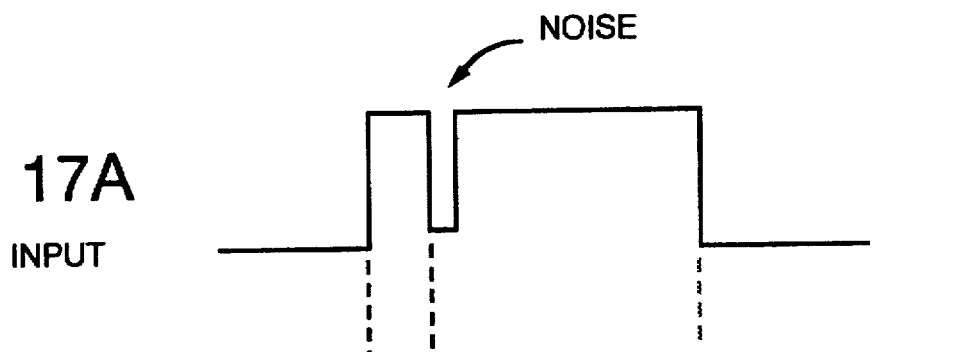
FIG. 17A
INPUT
FIG. 17B
OUTPUT OF OPERATIONAL AMPLIFIER 10
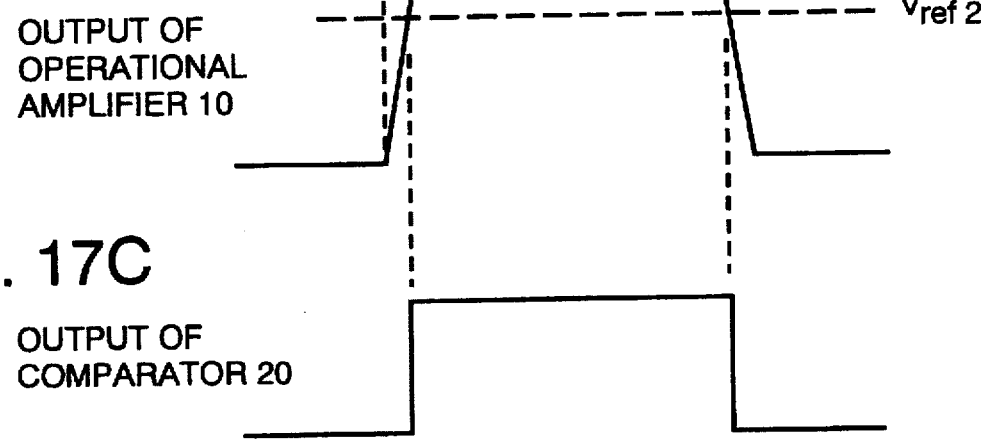
FIG. 17C
OUTPUT OF COMPARATOR 20
(PRIOR ART)

OPERATIONAL AMPLIFIER AND DIGITAL SIGNAL TRANSFER CIRCUIT

BACKGROUND OF THE INVENTION

1. Field of the Invention

The present invention relates to an operational amplifier which can remove a noise superposed on an input signal and a digital signal transfer circuit using the operational amplifier.

2. Description of the Prior Art

FIG. 15 shows a common digital signal transfer circuit functioning as a digital signal filter, which removes noise superposed on a digital signal and outputs a signal without a noise component.

FIG. 15 shows a circuit which comprises a CR filter comprising resistor R and capacitor C. When the circuit receives a digital input signal (see FIG. 16A) including noise components, the CR filter removes the noise components from the signal which includes high frequency noise components. The input signal from which noise is removed by the CR filter is distorted by the time constant of the CR filter (see FIG. 16B), and then wave-shaped by a differential type comparator and outputs to node A a digital signal without noise (see FIG. 16C).

Therefore, in a circuit using a CR filter, it is necessary to use a large value of capacitor C to completely remove the noise which is superposed on the input signal, in order to increase the CR time constant in the CR filter. It is difficult to incorporate a large value of capacitor C into a semiconductor integrated circuit together with the comparator. For this reason, capacitor C is required to be outside of an IC circuit, which requires a larger number of components as well as difficulties of assembly, and a greater cost.

The present invention provides a digital signal transfer circuit suitable for incorporation into a semiconductor integrated circuit, which can remove noise superposed on the input digital signal.

Furthermore, the present invention provides an operational amplifier which is less affected by the noise instantly changing from high to low which is superposed on the input signal.

SUMMARY OF THE INVENTION

According to one aspect of the invention, an operational amplifier comprises: differential pair of transistors comprising a first transistor of a first conductive type whose control electrode receives an input signal and whose one main electrode is connected to a first power supply potential node, and a second transistor of the first conductive type whose control electrode receives an output signal and whose the other main electrode is connected to the other main electrode of the first transistor, and whose the other main electrode functions as an output node of the differential pair of transistors; a current mirror circuit comprising a third transistor of second conductive type whose one main electrode and a control electrode are both connected to the output node of the differential pair of transistors, and a fourth transistor of second conductive type whose control electrode is connected to the control electrode of the third transistor and whose the other main electrode is coupled to the first power supply potential node, and whose one main electrode of the fourth transistor functions as an output node of the current mirror circuit; a fifth transistor of second conductive type whose one main electrode is connected to an output terminal, whose the other main electrode is coupled to the first power supply potential node, and whose control electrode is connected to the output node of the current mirror circuit; and a capacitive element connected between the output node of the current mirror circuit and the output terminal.

According to another aspect of the invention, an digital signal transfer circuit comparing an operational amplifier having a non-inverted input for receiving a digital input signal, and a comparator having a non-inverted input for receiving an output of the operational amplifier and an inverted input for receiving a reference voltage: wherein the operational amplifier comprises, differential pair of transistors comprising a first transistor of first conductive type whose control electrode is connected to non-inverted input, and a second transistor of first conductive type whose control electrode receives reference voltage and whose the other main electrode is connected to the other main electrode of the first transistor; a current mirror circuit comprising a third transistor of second conductive type whose one main electrode and control electrode are both connected to a one main electrode of the second transistor, and the other main electrode is connected to a first power supply potential node, and a fourth transistor of second conductive type whose control electrode is connected to the control electrode of the third transistor, whose one main electrode is connected to one main electrode of the first transistor and the other main electrode is connected to the first power supply potential node, and whose one main electrode of the fourth transistor functions as an output node of the current minor circuit; a fifth transistor of second conductive type whose one main electrode is connected to an output terminal, the other main electrode is connected to a first power supply potential node, and whose control electrode is connected to the output node of the current mirror circuit; and a capacitive element which is connected between the output node of the current mirror circuit and the output terminal.

BRIEF DESCRIPTION OF THE DRAWINGS

FIGS. 17(a)–17(c) shows timing charts indicating an input-output relation of an operational amplifier when pulse type noise is input into a conventional circuit.

DETAILED DESCRIPTION OF PREFERRED EMBODIMENTS

Embodiment 1

Figure 1:
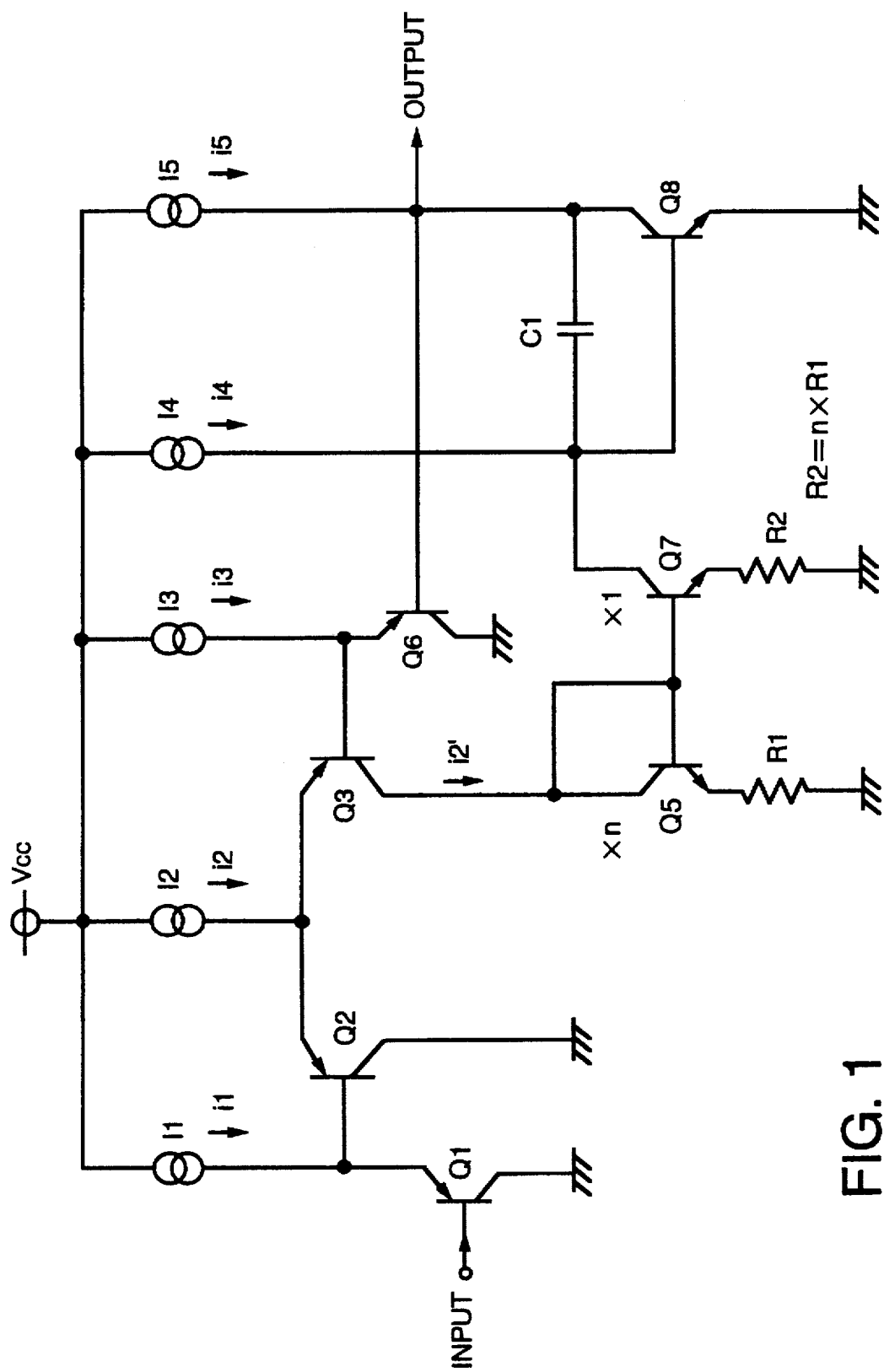
FIG. 1 shows an operational amplifier of a first embodiment of the present invention.

FIG. 1 shows an operational amplifier of a first embodiment of the present invention, which is an operational amplifier which is mixed with a current-feedback operational amplifier and a voltage feedback operational amplifier. The present operational amplifier can transfer a signal while removing noise superposed on an input digital signal. Moreover, this operational amplifier is suitable for incorporation into a semiconductor integrated circuit. This operational amplifier also reduces the effect of noise that instantly changes from high to low and which is superposed on the input signal, even if the amplifier is used as a general operational amplifier. In addition, this operational amplifier can be used as a noise removing circuit.

In FIG. 1, a base of PNP transistor Q1 is connected to a non-inverting input terminal (+) where an input signal is applied, and its collector is grounded. Constant current source I1 is connected between power supply potential node Vcc and an emitter of transistor Q1 and supplies constant current i1 to the emitter of the PNP transistor Q1. This constant current source I1 comprises a bipolar transistor as is generally known, and constitutes a first input buffer combined with the PNP transistor Q1.

PNP transistor Q6 has the same characteristic as the PNP transistor Q1, whose base is connected to an output terminal and whose collector is grounded. Constant current source I3 is connected between the power supply potential node Vcc and an emitter of the transistor Q6 and supplies constant current i3 to the emitter of PNP transistor Q6. This constant current source I3, which has the same characteristic as the constant current source I1, comprises a bipolar transistor as is generally known, and constitutes a second input buffer combined with the PNP transistor Q6.

A base of PNP transistor Q2, which receives the input signal input into the non-inverting input terminal (+) via the first input buffer, is connected to an emitter of the PNP transistor Q1 and its collector is grounded. A base of PNP transistor Q3, which is coupled to the output terminal (an inverted input directly connected to the output terminal) via the second input buffer and receives the output signal, is connected to the emitter of the PNP transistor Q6, and an emitter of PNP transistor Q3 is connected to the emitter of the PNP transistor Q2. These transistors Q3 and Q2 constitute a differential pair of transistors where a collector of PNP transistor Q3 functions as an output node. This transistor Q3 has the same characteristic as the PNP transistor Q2, and the collector current of the transistor Q3, that is, an output current of the differential pair of transistors, is the same as the collector current of the PNP transistor Q2, if the same potential is applied to both the base of transistor Q3 and the base of transistor Q2.

Constant current source I2 is connected between the power supply potential node Vcc and the emitters of PNP transistors Q2 and Q3, which are connected to each other, and supplies constant current i2 to the emitters of the PNP transistors Q2 and Q3. This constant current supply I2 comprises bipolar transistors as is generally known.

A collector of NPN transistor Q5 is connected to the output node of the differential pair of transistors, that is, the collector of PNP transistor Q3, and a base is connected to its collector. Resistive element R1 is connected between an emitter of NPN transistor Q5 and a ground node.

A base of NPN transistor Q7 is connected to the base of the NPN transistor Q5. Transistors Q5 and Q7 constitute a current mirror circuit in which a collector of NPN transistor Q7 functions as an output node. This current mirror circuit has a collector current ratio of n:1 between the NPN transistor Q5 and NPN transistor Q7, in other words, NPN transistor Q7 has smaller collector current by 1/n than that of the NPN transistor Q5. Resistive element R2 is connected between an emitter of NPN transistor Q7 and a ground node. A resistive ratio between resistive element R1 and R2 is 1:n, in other words, resistive element R2 has a resistance n times that of R1.

Constant current source I4 is connected between the power supply potential node Vcc and the collector of the NPN transistor Q7, and provides constant current i4 to the collector of the NPN transistor Q7. This constant current source I4 comprises bipolar transistors as is generally known, and has constant current i4 which has the current value of 1/2n times in comparison with the constant current i2 of constant current source I2, in order to avoid an offset when the potential of non-inverting input terminal (+) is the same as that of the inverting input connected to the base of transistor Q6. This relationship between constant current i4 and constant current i2 is obtained as $i2=2\times i2'=2\times n\times i4$.

A base of NPN transistor Q8 is connected to the output node of the current mirror circuit, that is, the collector of NPN transistor Q7, and its collector is connected to the output terminal, and its emitter is grounded. A constant current source I5 is connected between the power supply potential node Vcc and the collector of the transistor Q8, and provides constant current i5 to the collector of the NPN transistor Q8. Constant current source I5 also comprises bipolar transistors, as is generally known.

A capacitive element C1 is connected between the output node of the current mirror circuit, that is, the collector of NPN transistor Q7 and the output terminal, that is, the collector of the NPN transistor Q8.

An operation of the operational amplifier of this construction is explained as follows. First, the stable operation is explained, in case that the potential of non-inverted input terminal (+) is the same as that of the output terminal (that is, the base of transistor Q3). In this case, the same value of potential is applied to the bases of PNP transistors Q2 and Q3, which constitute a differential pair of transistors, and the collector currents of PNP transistors Q2 and Q3 are the same, that is, 1/2 times of constant current source I2 is respectively supplied as constant current i2.

Since collector current i2' of PNP transistor Q3 is $1/2 \times i2$, the collector current of NPN transistor Q5 is also $1/2 \times i2$, and then the collector current of NPN transistor Q7 is $1/2 \times i2 \times 1/n$.

Since the collector current of NPN transistor Q7 and constant current i4 supplied by constant current source I4 are both 1/2n times of constant current i2, constant current source I4 provides no current to NPN transistor Q8 and to capacitive element C1, and no current is output from NPN transistor Q7.

Therefore, NPN transistor Q7 keeps the same state. That is, the potential of the output is kept as it is, without any current flows to and from the output terminal.

In this state, if the potential of the non-inverting input terminal (+) suddenly increases to higher than the potential of the output terminal, in other words, when input digital signal changes from low to high suddenly, the operational amplifier operates as follows. The potential change from low to high at the non-inverting input terminal (+) is transferred via the fast input buffer to the base of PNP transistor Q2 which constitutes one side of the differential pair of transistors. As a result, the base potential of PNP transistor Q2 becomes higher than that of the base of PNP transistor Q3, the conductivity of PNP transistor Q2 becomes lower than that of PNP transistor Q3, then the collector current of PNP transistor Q2 becomes smaller than $1/2 \times i2$ (that is $1/2 \times i2 - \alpha$), while the collector current of PNP transistor. Q3 becomes larger than $1/2 \times i2$ (that is $1/h \times i2 + \alpha$) where $\alpha$ indicates the extent of increase or decrease of current.

Since collector current i2' of PNP transistor Q3 is $(1/h \times i2 + \alpha)$, the collector current of NPN transistor Q5 is also $(1/h \times i2 + \alpha)$, and the collector current of NPN transistor Q7 becomes $(1/h \times i2 + \alpha) \times 1/n$.

Since the collector current of NPN transistor Q7 becomes $(1/h \times i2 + \alpha) \times 1/n$, which is larger by $\alpha/n$ than constant current i4 which is supplied by the constant current source I4, this differential current $\alpha/n$ is compensated with the current which is pulled out of the base of NPN transistor Q8 and capacitive element C1.

As a result, the conductivity of NPN transistor Q8 decreases, the potential of the output terminal increases, and a part of constant current i5 supplied by constant current source I5 flows out of the output terminal. As the potential of the output terminal increases, this change of the potential is transferred via the second input buffer to the base of PNP transistor Q3 which constitutes the differential pair of transistors. This operation continues until the base potential of PNP transistor Q3 becomes the same as that of PNP transistor Q2.

When the base potential of PNP transistor Q3 becomes the same as that of PNP transistor Q2, the operational amplifier turns into the state explained above, where the potential of the output terminal becomes the same as that of the non-inverting input terminal (+), that is, the potential of the input signal, where no current flow to or from the output terminal. Therefore, when the input signal changes from low to high, the digital signal changing from low to high which has a desired through-rate is output from the output terminal, which means that the input signal is transferred as the output signal.

On the other hand, if the potential of the non-inverting input terminal (+) decreases under the potential of the output terminal when receiving the input signal, in other words, the digital input signal changes from high to low, the operational amplifier operates as follows. The potential change of the non-inverting input terminal (+) from high to low is transferred via the first input buffer to the base of PNP transistor Q2 which constitutes one side of the differential pair of transistors. As a result, the base potential of PNP transistor Q2 decreases under the potential of the base of PNP transistor Q3, and the conductivity of PNP transistor Q2 increases over that of PNP transistor Q3. Therefore, the collector current of PNP transistor Q2 becomes $(1/2 \times i2 + \alpha)$ which is larger by $\alpha$ than $1/2 \times i2$, and the collector current of PNP transistor Q3 becomes $(1/2 \times i2 - \alpha)$ which is smaller by $\alpha$ than $1/2 \times i2$.

Since collector current i2' of PNP transistor Q2 is $(1/2 \times i2 - \alpha)$, the collector current of NPN transistor Q5 is also $(1/2 \times i2 - \alpha)$, and the collector current of NPN transistor Q7 is $(1/2 \times i2 - \alpha) \times 1/n$.

Since the collector current of NPN transistor Q7 is $(1/2 \times i2 - \alpha) \times 1/n \times i2$, the current which flows in NPN transistor Q7 is smaller by $\alpha/n$ than constant current i4 supplied by constant current source I4. Therefore, this differential current $\alpha/n$ flows from constant current source I4 into the base of NPN transistor Q8 and capacitive element C1.

As a result, the conductivity of NPN transistor Q8 increases, the potential of the output terminal decreases, and current is pulled from the output terminal. This decrease of output terminal potential is transferred via the second input buffer to the base of PNP transistor Q3 which constitutes one side of the differential pair of transistors. This operation continues until the base potential of PNP transistor Q3 becomes the same as that of PNP transistor Q2.

When the base potential of PNP transistor Q3 becomes the same as that of PNP transistor Q2, the operational amplifier turns to the state explained above, where the potential of the output terminal becomes the same as that of the non-inverting input terminal (+), that is, the potential of the input signal, where there is no current flow to or from the output terminal. Therefore, when the input signal changes from high to low, the digital signal changing from high to low which has a desired through-rate is output from the output terminal, which means that the input signal is transferred as the output signal.

As described above, when the input signal changes from high to low, the emitter potential of PNP transistor Q2 decreases temporally, a reverse bias is applied to the base-emitter of PNP transistor Q3 and the base-emitter of PNP transistor Q6, and then the reverse-biased current flows temporarily through PNP transistor Q3. Since the reverse-biased current flows to the ground node via PNP transistor Q2, it does not influence the current mirror circuit and the NPN transistor Q8 which is the output transistor; therefore, the voltage of the output terminal changes from high to low in response to the change of input signal from high to low.

Since the operational amplifier of this construction may have a through-rate, it is not possible to output a frequency higher than a predetermined frequency, if it is input into the non-inverting input terminal (+), which removes the noise having high frequency.

Specifically, the cut-off frequency f of the operational amplifier of this construction is obtained as follows.

$$f = I4/\{2CV \cdot \exp(-3/20)\}$$

where,

V: input voltage,

C: capacity of capacitor C1, R1,

R2: resistance of resistive elements and $R1=R2=0\ \Omega$ here, and the size of transistor Q5 is the same as that of transistor Q7 (in case n=1).

At this time, it is necessary to make the switching speed of PNP transistors Q1, Q2, Q3, and Q6 faster than the through-rate in order to obtain a lower cut-off frequency. Therefore, in the operational amplifier of the present embodiment, constant currents i1, i2, and i3 supplied from constant current sources I1, I2, and I3, respectively, are designed to make the switching speed of PNP transistors Q1, Q2, Q3, and Q6 faster than the through-rate.

Furthermore, if n is more than one in the current mirror ratio n:1 between the transistors Q5 and Q7, it is possible to increase the constant current i2 supplied from the constant current source I2, even if both constant current i4 supplied from constant current source I4 and the cut-off frequency decreases. In this way, it is possible to make the switching speed of PNP transistors Q1, Q2, Q3, and Q6 faster than the through-rate.

It is clear from the above explanation that the operational amplifier can transfer the signal by removing the noise from the digital signal, in other words, the operational amplifier can remove a frequency higher than a predetermined value from the digital input signal input into the non-inverting input terminal (+) and, therefore, can output the signal as the digital output signal from the output terminal, and also the operational amplifier does not require a capacitor having large capacity. Moreover, this operational amplifier can be used both as a digital signal transfer circuit which is suitable for incorporation into in a semiconductor integrated circuit and also as a noise removing circuit. In this operational amplifier, sudden change of the input signal from high to low at the input does not influence to the output terminal.

In addition, the operational amplifier can be used as a noise filter or a noise removing circuit, since it is not influenced by the noise superposed on the analog signal input into non-inverting input terminal (+), and then output signal from the output terminal can be obtained without the noise.

Embodiment 2

Figure 2:
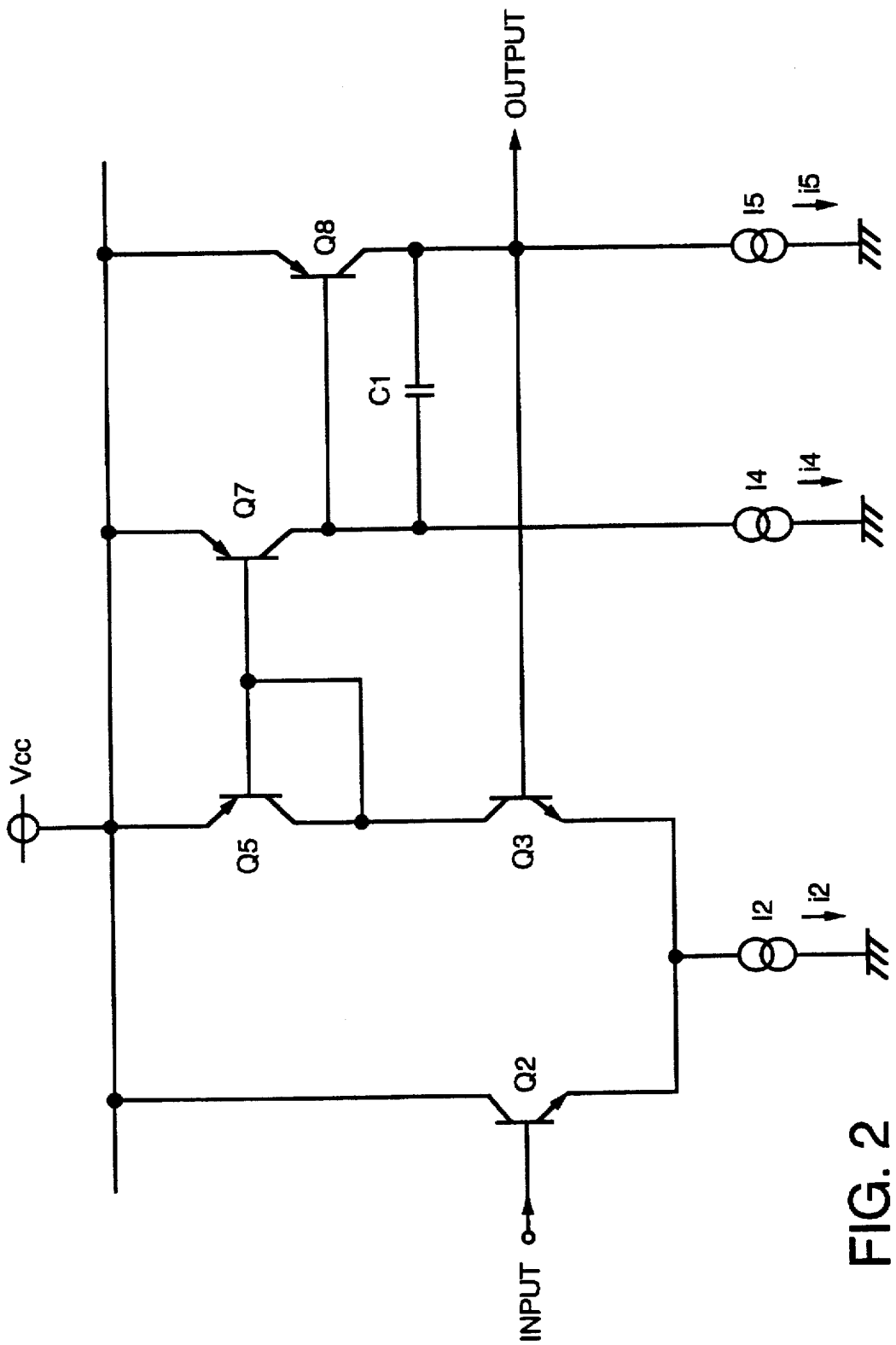
FIG. 2 shows an operational amplifier of a second embodiment of the present invention.

FIG. 2 shows an operational amplifier of a second embodiment of the present invention. FIG. 2 shows the operational amplifier of FIG. 1 in which PNP transistors Q2, Q3 are replaced by NPN transistors. That is, the PNP transistors are replaced by the NPN transistors, other PNP transistors in the circuit are replaced by NPN transistors, and the current sources are moved from the power supply side to the ground side. Since this type of circuit alteration is well known to a person skilled in the art, further explanation is omitted.

Since the differential pair of transistors comprise the NPN transistors in the second embodiment, the first and the second input buffer circuits of the first embodiment can be omitted, and then a base of NPN transistor Q2 is connected directly to non-inverting input terminal (+), while a base of NPN transistor Q3 is connected directly to an output terminal (an inverting input).

The operational amplifier of this construction operates in the same way as that shown in the first embodiment and has the same effect. Here, the elements having the same reference numbers in FIG. 2 are the same portions or the corresponding portions having the same functions as those in FIG. 1.

Embodiment 3

Figure 3:
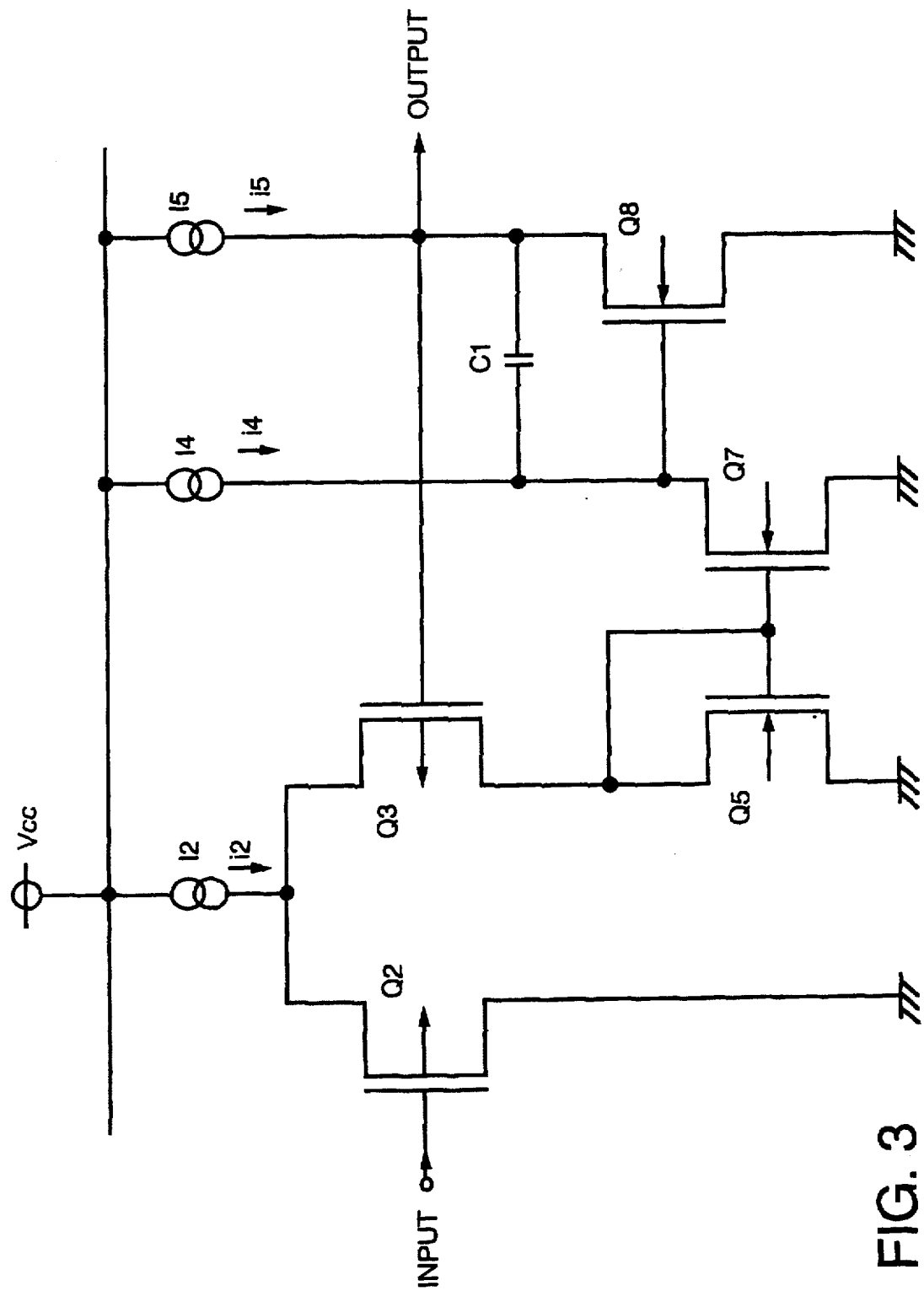
FIG. 3 shows an operational amplifier of a third embodiment of the present invention.

FIG. 3 shows an operational amplifier of a third embodiment of the present invention. In FIG. 3, PNP transistors Q2, Q3 shown in FIG. 1 are replaced by P channel MOS transistors, and NPN transistors Q5, Q7, and Q8 are replaced by N channel MOS transistors. In the same way, constant current sources I2, I4, and I5 comprise MOS transistors as is generally known.

Since the differential pair of transistors comprise P channel MOS transistors in the third embodiment, the first and the second input buffer circuits shown in the first embodiment can be omitted, and a base of P channel MOS transistor Q2 is connected directly to non-inverting input terminal (+), while a base of P channel MOS transistor Q3 is connected directly to an output terminal (an inverted input).

The operational amplifier of this construction operates in the same way as that shown in the first embodiment, and has the same effect as that of the first embodiment. Here, the elements having the same reference numbers in FIG. 3 are the same portions or the corresponding portions having the same functions as those in FIG. 1.

Embodiment 4

Figure 4:
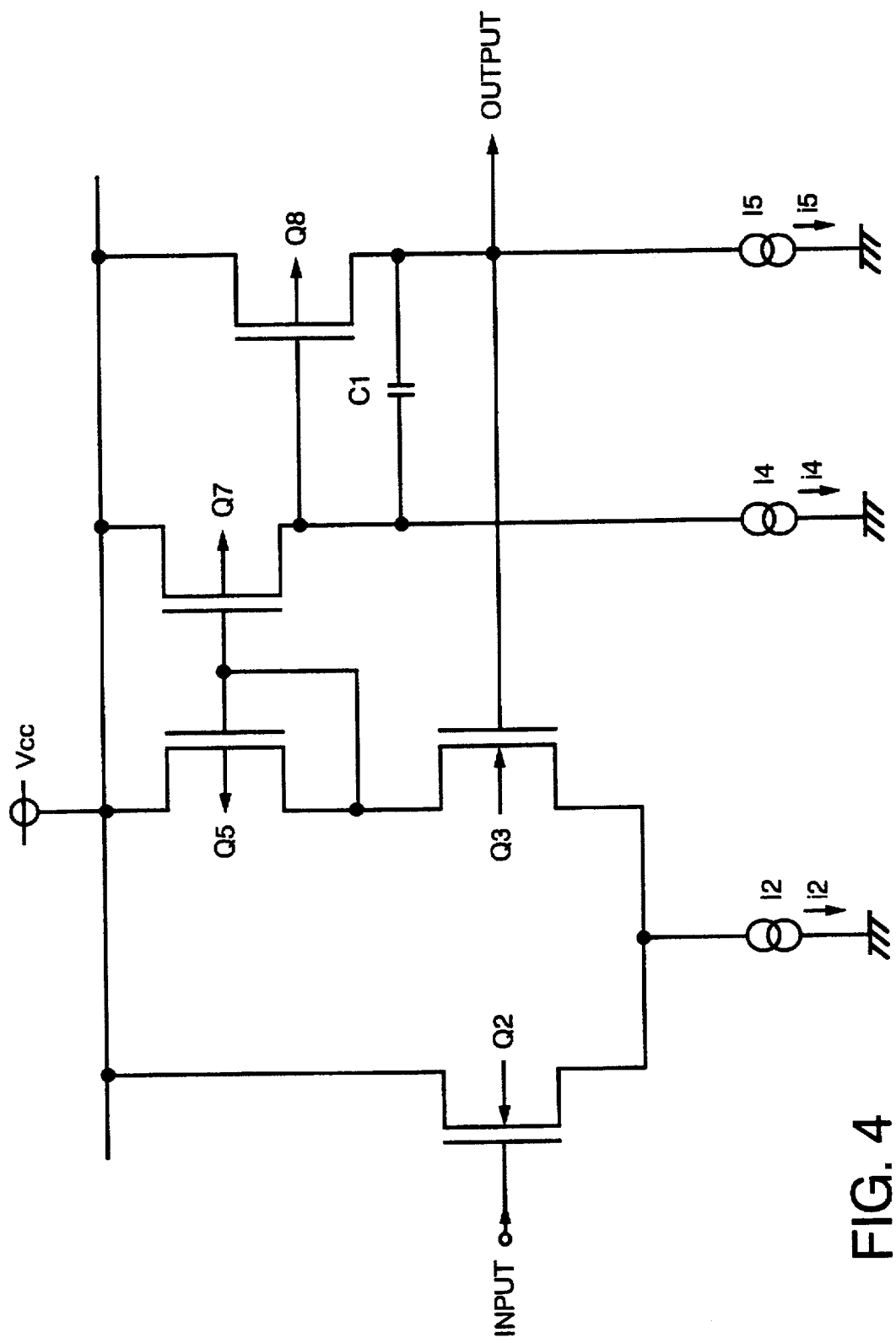
FIG. 4 shows an operational amplifier of a fourth embodiment of the present invention.

FIG. 4 shows an operational amplifier of a fourth embodiment of the present invention. The operational amplifier of the fourth embodiment and that in the second embodiment are different from the view point that the MOS transistors are used in the fourth embodiment while the bipolar transistors are used in the second embodiment. In other words, NPN transistors Q2 and Q3 in the operational amplifier of the second embodiment are replaced by the N channel MOS transistors in the fourth embodiment. In the same way, constant current sources I2, I4, and I5 comprise MOS transistors as is generally known.

The operational amplifier of this construction operates in the same way as that shown in the second embodiment, and has the same effect as that of the second embodiment. Here, the elements having the same reference numbers in FIG. 4 are the same portions or the corresponding portions having the same functions as those in FIG. 2.

Embodiment 5

Figure 5:
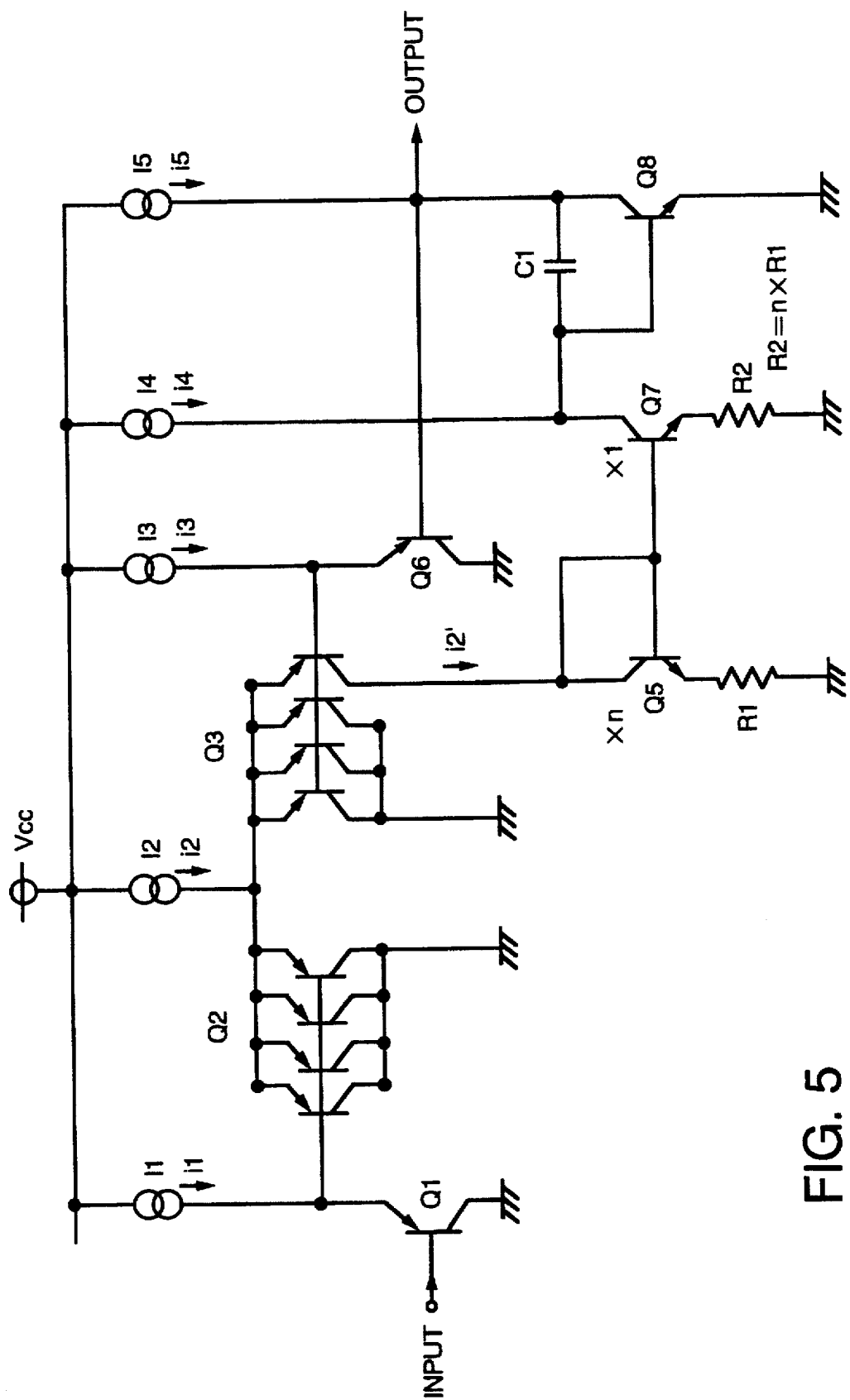
FIG. 5 shows an operational amplifier of a fifth embodiment of the present invention.

FIG. 5 shows an operational amplifier of a fifth embodiment of the present invention. PNP transistors Q2 and Q3 shown in FIG. 1 are replaced by a plurality of PNP transistors (for, example, four PNP transistors) which are connected in parallel and each has the same characteristic as that of FIG. 1. A collector of one of the parallel PNP transistors Q3 is connected to a collector of NPN transistor Q5 as an output node of the differential pair of transistors, and remaining collectors of the other PNP transistors are grounded. The other portions are the same as those of the first embodiment shown in FIG. 1.

As a result of this construction, when the potentials of both the non-inverting input terminal (+) and the output terminal are the same, that is, the operation of the operational amplifier is stable, the collector currents of parallel PNP transistors Q2 and Q3 are the same, that is, 1/2 of constant current i2 which is supplied by constant current source I2. Since equivalent current flows in each of the parallel PNP transistors, the collector current i2' of one PNP transistor of the parallel PNP transistors which are connected to the collector of NPN transistor Q5 is 1/4 of 1/2×i2 of the fifth embodiment.

Therefore, a collector current of NPN transistor Q5 also becomes 1/2×i2×1/4, and then a collector current of NPN transistor Q7 becomes 1/2×i2×1/4×1/n. Therefore, the constant current i4 of constant current source I4 also becomes 1/2×i2×1/4×1/n.

As a result, in the fifth embodiment, a large ratio of 8n to 1 can be obtained between constant current i2 of constant current source I2 and constant current i4 of constant current source I4. In this embodiment, therefore, it is possible to decrease constant current i4 of constant current source I4, increase the cut-off frequency, and increase constant current i2 of constant current source I2, in order to make the switching speed of PNP transistors Q1, Q2, and Q3 faster than the through-rate. The operational amplifier of the present embodiment has the same effect as those of the amplifier of the first embodiment.

Embodiment 6

Figure 6:
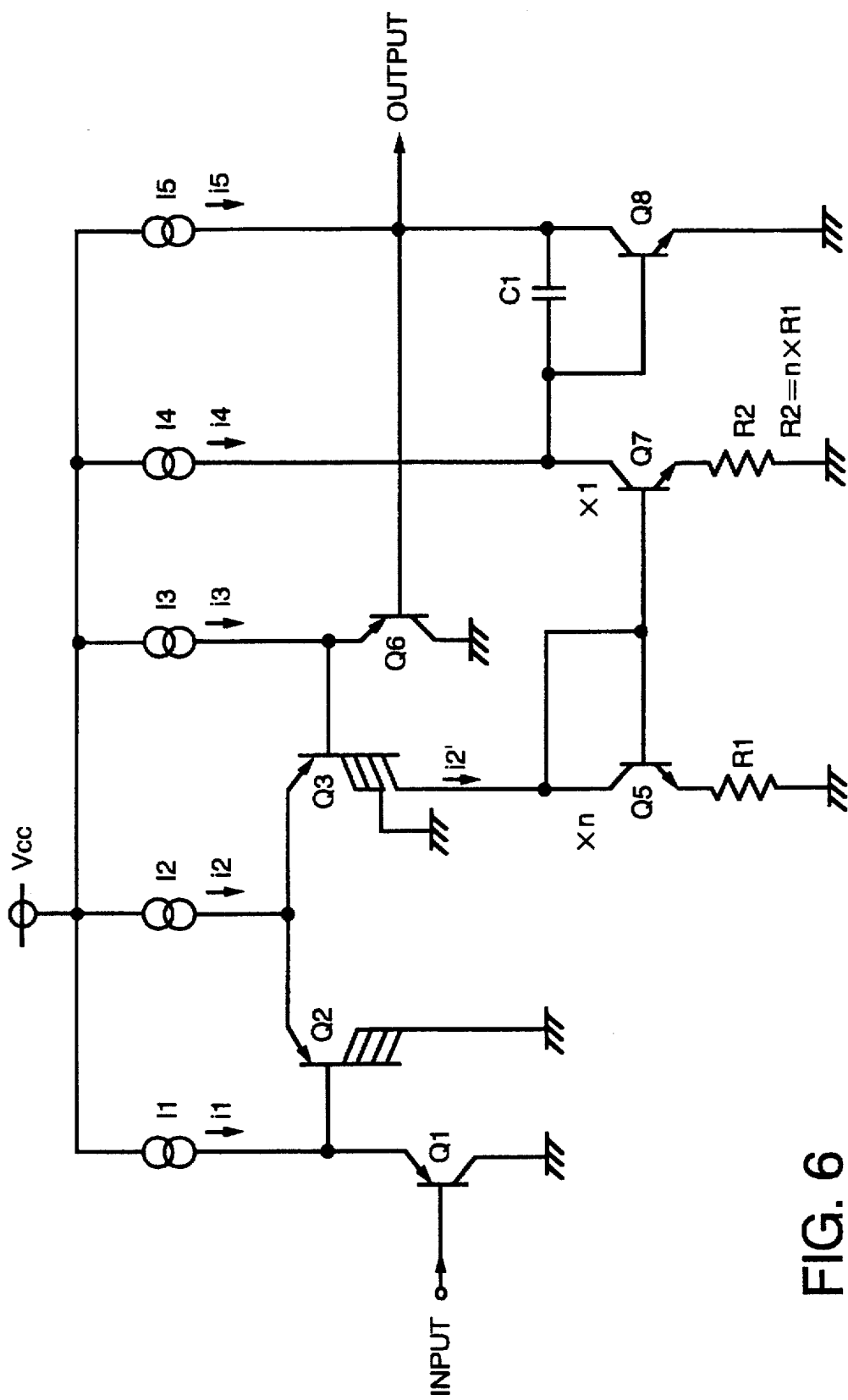
FIG. 6 shows an operational amplifier of a sixth embodiment of the present invention.

FIG. 6 shows an operational amplifier of a sixth embodiment of the present invention. The parallel transistors Q2, Q3 shown in FIG. 5 are replaced by multi-transistors each having a plurality of collectors as shown in FIG. 6. The operation of these multi-transistors is the same as the parallel transistors of the fifth embodiment. In FIG. 6, each transistor Q2, Q3 has a plurality of collectors, and one of the collectors of transistor Q3 is connected to a collector of transistor Q5. The operational amplifier of the sixth embodiment has the same effects as those of the operational amplifier of the fifth embodiment.

Embodiment 7

Figure 7:
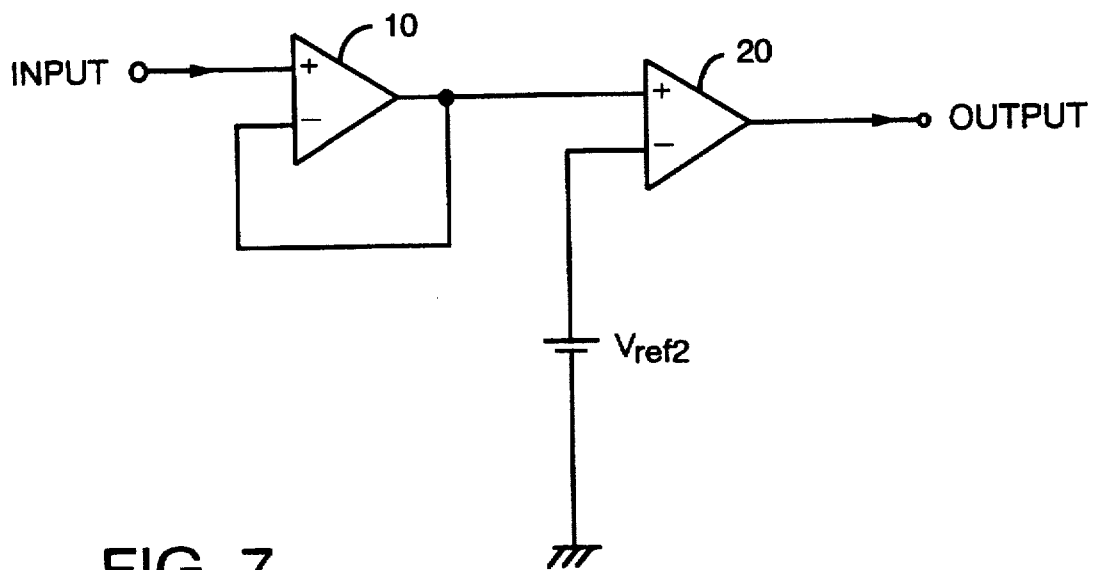
FIG. 7 shows a digital signal transfer circuit of a seventh embodiment of the present invention.

FIG. 7 shows a digital signal transfer circuit of a seventh embodiment of the present invention. The digital signal transfer circuit of the present embodiment can transfer the signal by removing noise superposed on a generated digital signal. The invention of the seventh embodiment is used not only as a digital signal transfer circuit suitable for incorporation into a semiconductor integrated circuit but also as a noise removing circuit or as a digital signal filter.

In FIG. 7, operational amplifier 10 functions as a voltage follower having a predetermined through-rate, which removes the noise superposed on the input signal, where a digital input signal is input into non-inverting input terminal (+) and inverting input terminal (−) is connected to an output terminal. The operational amplifier shown from the first to the sixth embodiments are used as this operational amplifier 10.

The output of the operational amplifier 10 is connected to non-inverting input terminal (+) of a comparator 20, and a reference voltage (comparison voltage) $V_{ref2}$ is applied to an inverting input terminal (−) of the comparator 20, and the digital output signal without noise is output to the output terminal of the comparator 20. The comparator 20 is a comparator which is commonly used as a wave form shaping circuit, which is comprised of bipolar transistors when the operational amplifier 10 comprises bipolar transistors. However, when the operational amplifier 10 is comprised of MOS transistors, the comparator 20 is comprised of MOS transistors. The comparator 20 is incorporated in a semiconductor integrated circuit together with the operational amplifier 10.

An operation of the circuit of such circuit configuration is explained as follows. First, when low and high digital signals are input as input signals, the operational amplifier 10 of voltage follower type outputs low and high digital signals having the same potentials as those of input signals to the output terminal. The comparator 20 receives these low and high digital signals at non-inverting input terminal (+), and compares them with the reference voltage $V_{ref2}$ received at the inverting input terminal (−). This circuit outputs a low digital signal when the digital signal is lower than the reference voltage $V_{ref2}$, while it outputs a high digital signal when the digital signal is higher than the reference voltage $V_{ref2}$ according to the input signal.

When the input signal changes from low to high, the operational amplifier 10 operates as explained from the first to the sixth embodiments, and outputs the signal to the output terminal, which changes from low to high having the predetermined through-rate. When the output of operational amplifier 10 changes from low to high, the comparator 20 instantly raises the output from low to high, and outputs a high digital signal to the output terminal when the input voltage at the non-inverting terminal of the comparator 20 reaches the reference voltage $V_{ref2}$.

When the input signal changes from high to low, the operational amplifier 10 operates as explained from the first to the sixth embodiments, and outputs the signal to the output terminal, which changes from high to low having the predetermined through-rate. When the output of operational amplifier 10 changes from high to low, the comparator 20 instantly lowers the output from high to low, and outputs a low digital signal to the output terminal when the input voltage at the non-inverted terminal of the comparator 20 decreases to the reference voltage $V_{ref2}$.

Since operational amplifier 10 has the predetermined through-rate as explained above, even when the noise turning to low is superposed on the high input signal, or in case that the noise turning to high is superposed on the low input signal, the noise does not affect the output of operational amplifier 10, if the noise frequency is higher than the predetermined value. Moreover, even when the output of operational amplifier 10 changes to some extent, the output from comparator 20 is not influenced by the noise, if the output of the operational amplifier 10 does not drop lower than the reference voltage $V_{ref2}$.

Therefore, it is possible to obtain a digital signal transfer circuit which can transfer the signal by removing the noise superposed on the digital signal, and which is suitable for incorporation into a semiconductor integrated circuit.

Embodiment 8

Figure 8:
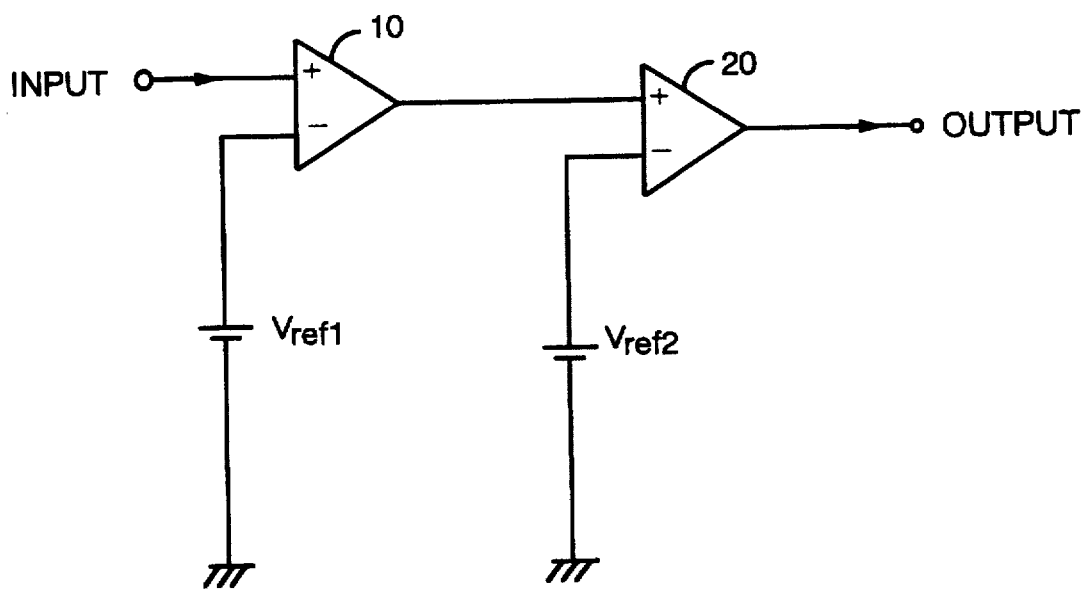
FIG. 8 shows a digital signal transfer circuit of an eighth embodiment of the present invention.
Figure 9:
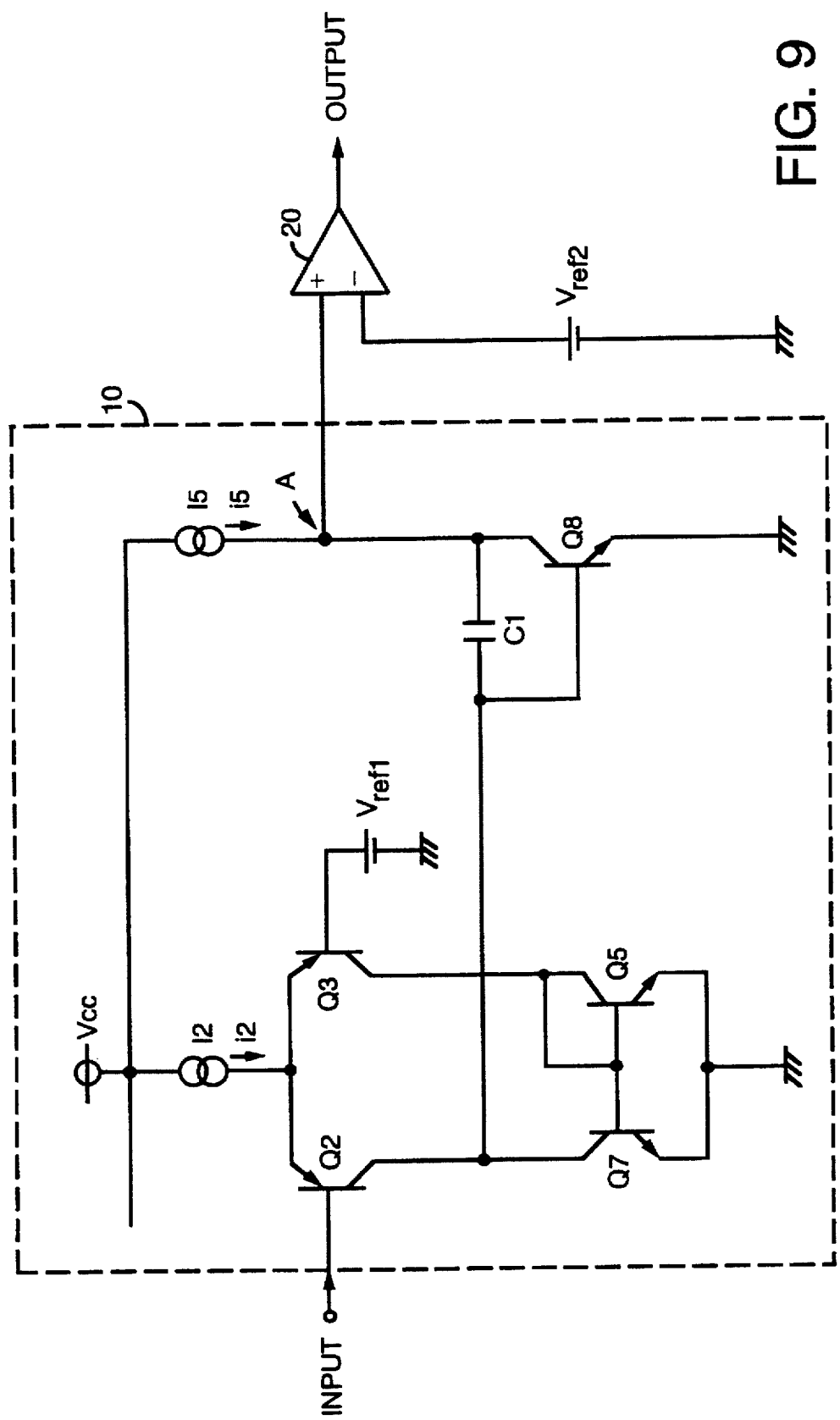
FIG. 9 shows a detailed circuit of the operational amplifier shown in FIG. 8.

FIG. 8 and FIG. 9 show an eighth embodiment of the present invention. The present embodiment provides a digital signal transfer circuit which can transfer the signal by removing the noise superposed on the input digital signal, and is suitable for incorporation into a semiconductor integrated circuit. In FIG. 8, the output of the operational amplifier 10 is connected to non-inverting input terminal (+) of a comparator 20, and a reference voltage (comparison voltage) $V_{ref2}$ is applied to inverting input terminal (−) of the comparator 20, and the digital output signal without noise is output to the output terminal of the comparator 20. The comparator 20 is a comparator which is commonly used as a wave form shaping circuit, which is comprised of bipolar transistors where the operational amplifier 10 comprises bipolar transistors. However, when the operational amplifier 10 is comprised of MOS transistors, the comparator 20 is comprised of MOS transistors. The comparator 20 is incorporated in a semiconductor integrated circuit together with the operational amplifier 10.

FIG. 9 shows a construction of the operational amplifier 10 of the eighth embodiment. In FIG. 9, a base of NPN transistor Q2 receives input signals inputted into non-inverting input terminal (+) and its collector is connected to an output node. a base of PNP transistor Q3 receives a first reference voltage $V_{ref1}$ applied to an inverted input terminal (−) and its emitter is connected to an emitter of the PNP transistor Q2. PNP transistors Q2 and Q3 constitute a differential pair of transistors. Transistor Q3 has the same characteristic as that of the PNP transistor Q2, that is, a collector current of transistor Q3 is the same as an output current of the differential pair of transistors which is a collector current of the PNP transistor Q2, if a base potential of transistor Q3 is the same as that of transistor Q2.

Constant current source I2 is connected between power supply potential node Vcc and the commonly connected emitters of the PNP transistors Q2 and Q3, and provides constant current i2 to the emitters of the PNP transistors Q2 and Q3. This constant current source I2 comprises bipolar transistors as is generally known.

A collector of NPN transistor Q5 is connected to the collector of the PNP transistor Q3, its base is connected to its collector and a base of transistor Q7, and its emitter is grounded. NPN transistors Q5 and Q7 constitute a current mirror circuit, and Q7 functions as an output side transistor, while the NPN transistor Q5 functions as an input transistor. The collector of NPN transistor Q7 is connected to the output node of the differential pair of transistors, that is, to the collector of the PNP transistor Q2. A base of the NPN transistor Q7 is connected to the base of the NPN transistor Q5 and comprises a mirror circuit together with the NPN transistor Q5. The collector of NPN transistor Q7 functions as an output node of the current mirror circuit. In the eighth embodiment, transistor Q7 has the same characteristic as the NPN transistor Q5, whose current mirror ratio is 1:1.

A base of NPN transistor Q8 is connected to the output node of the current mirror circuit, that is, the collector of NPN transistor Q7, the collector of Q8 is connected to an output node A, and its emitter is grounded. Constant current source i5 is connected between the power potential node Vcc and the collector of transistor Q8, provides constant current i5 to the collector of transistor Q8, and comprises bipolar transistors as is generally known. Capacitive element C1 is connected between the output node of the current mirror circuit, that is, the collector of the NPN transistor Q7, and the output node A, that is, the collector of the NPN transistor Q8.

An operation of the circuit of such circuit configuration is explained as follows. When the low digital signal is input as input signal, the operational amplifier 10 compares the low digital signal with the first reference voltage $V_{ref1}$, and outputs the low digital signal to output node A, since the input signal is lower than the first reference voltage $V_{ref1}$.

In other words, the lower level of potential is provided to PNP transistor Q2, while the first reference voltage $V_{ref1}$, which is higher than the lower level of potential, is provided to the base of PNP transistor Q3. Therefore, the conductivity of PNP transistor Q2 is higher than that of PNP transistor Q3. Since these transistors constitute a differential pair of transistors, the collector current of PNP transistor Q2 is $(1/2 \times i2+\alpha)$ which is larger than $1/2 \times i2$, while the collector current of PNP transistor Q3 is $(1/2 \times i2-\alpha)$ which is smaller than $1/2 \times i2$.

Since the collector current of PNP transistor Q2 is $(1/2 \times i2+\alpha)$, while the collector current of NPN transistor Q7 is $(1/2 \times i2-\alpha)$, differential current $2\alpha$ between them flows into both the base of NPN transistor Q8 and the capacitive element C1. Therefore, the conductivity of NPN transistor Q8 is high (low as a resistance), which decreases the potential of output node A, and pulls the current from output node A. This results in the lowering the level at the output node A.

Receiving the low digital signal from output node A at non-inverting input terminal (+), comparator 20 compares the voltage of this low digital signal with higher voltage of the second reference voltage $V_{ref2}$, then outputs the low digital signal according to the low input signal.

On the other hand, when the high digital signal is input as the input signal, operational amplifier 10 compares the high digital signal with the first reference voltage $V_{ref1}$, and outputs the high digital signal to output node A according to whether the input signal is higher than first reference voltage $V_{ref1}$.

In other words, since the low level potential is provided to PNP transistors Q2 and Q3 which constitute the differential pair of transistors, and a first reference voltage $V_{ref1}$, which is lower than a predetermined high level potential, is provided to the base of PNP transistor Q3, the conductivity of PNP transistor Q2 is lower than that of PNP transistor Q3. Therefore, the collector current of PNP transistor Q2 becomes $(1/2 \times i2-\alpha)$ which is smaller than $1/2 \times i2$, while the collector current of PNP transistor Q3 becomes $(1/2 \times i2+\alpha)$ which is larger than $1/2 \times i2$.

Since the collector current of PNP transistor Q3 is the same as that of NPN transistor Q3, the collector current of NPN transistor Q7 is also the same as that of PNP transistor Q3, that is $(1/2 \times i2+\alpha)$.

Since the collector current of PNP transistor Q2 is $(1/2 \times i2-\alpha)$, while the collector current of NPN transistor Q7 is $(1/2 \times i2+\alpha)$, the differential current $2\alpha$ is pulled from both the base of NPN transistor Q8 and capacitive element C1. Therefore, the conductivity of NPN transistor Q8 becomes low (high as a resistance), which increases the potential of output node A, which provides the current to the comparator 20.

Receiving the high digital signal from output node A at the non-inverting input terminal (+), comparator 20 compares the voltage of this high digital signal with the lower voltage of second reference voltage $V_{ref2}$, then outputs the high digital signal according to the high input signal.

When the input signal of non-inverting terminal changes from low to high, operational amplifier 10 compares the signal changing from high to low with first reference voltage $V_{ref1}$. As a result, the conductivity and the collector current of PNP transistor Q2, which constitute the differential pair of transistors, decrease, and the conductivity and the collector current of PNP transistor Q3 increase. As a result, the current which flows into the base of the NPN transistor Q8 and the capacitor C1 decreases by the difference $2\alpha$, and finally the current $2\alpha$ is pulled from the NPN transistor Q8 and the capacitor C1.

Therefore, the conductivity of NPN transistor Q8 becomes low (high as a resistance), which increases the potential of output node A, and supplies the current from the output node A. As a result, at the output node A, the potential changes from low to high with the predetermined through-rate, and output node A finally becomes a high level.

When the output of operational amplifier 10 changes from low to high and reaches reference voltage $V_{ref2}$, comparator 20 suddenly raises the output from low to high and outputs the high level digital signal to the output terminal.

On the other hand, when the input signal at the non-inverting terminal changes from high to low, the operational amplifier 10 compares the input signals changing from low to high with reference voltage $V_{ref1}$. As a result, the conductivity and the collector current of PNP transistor Q2, which constitutes one side of the differential pair of transistors, increase, and the conductivity and the collector current of PNP transistor Q3 decrease.

As a result, the current which is pulled from the base of the NPN transistor Q8 and the capacitor C1 decreases by the difference $2\alpha$, and finally the current $2\alpha$ is supplied to base of the NPN transistor Q8 and the capacitor C1. Therefore, the conductivity of NPN transistor Q8 is high (low as a resistance), which decreases the potential of output node A and pulls the current through the output node A. As a result, at the output node A, the potential changes from high to low with the predetermined through-rate, and output node A finally becomes a low level.

When the output of operational amplifier 10 changes from high to low and reaches reference voltage $V_{ref2}$, comparator 20 instantly decreases the output from high to low, and outputs the low digital signal. Since operational amplifier 10 has a predetermined through-rate, its output is not affected by the noise, for example, which turns to low when the input signal is high, or which turns to high when the input signal is low, superposed on the signal, if the frequency of noise is more than a predetermined frequency. Furthermore, even when the output of operational amplifier 10 changes to some extent, the output from comparator 20 is not affected by the noise, if the output of operational amplifier 10 changes less than the reference voltage $V_{ref2}$ which is applied to comparator 20.

Therefore, it is possible to obtain a digital signal transfer circuit which can transfer the signal by removing the noise superposed on the digital signal, and which is suitable for incorporation in a semiconductor integrated circuit.

A method of removing the superposed noise which turns to low when input signal is high is explained in detail, using FIG. 17A and FIG. 17B. If the noise which turns to low is applied when the input signal is high as shown in FIG. 17A, the output of operational amplifier 10 having the predetermined through-rate changes from high to low in response to the input signal change from high to low. After then, when the noise of the input signal changes from low to high as shown in FIG. 17B, the output of operational amplifier 10 having the predetermined through-rate turns to high.

Figure 15:
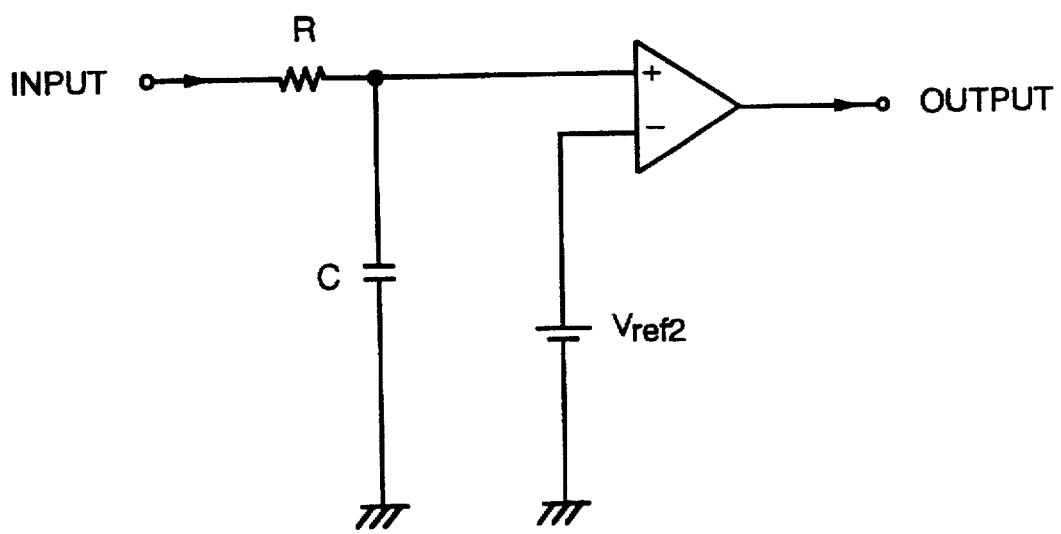
FIG. 15 shows a conventional digital signal transfer circuit.
Figure 16A:
FIGS. 16(a)–16(c) show timing charts indicating input-output signals of a digital signal transfer circuit of a conventional operational amplifier.
Figure 16B:
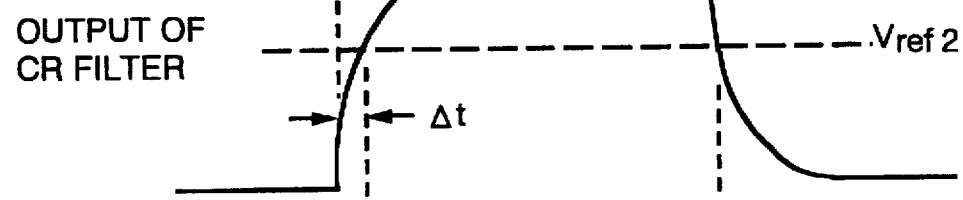
Figure 16C:

Therefore, unless the potential change of the noise appearing at the output of operational amplifier 10 becomes lower than the second reference voltage $V_{ref2}$, the output of comparator 20 is not affected by the noise, that is, the output signal where the noise is removed is obtained. For example, when the noise is input having a voltage of 0–5 V and a frequency of approximately 3.5 MHz, a time constant CR of $2 \times 10^{-7}$ is necessary for the conventional circuit shown in FIG. 15. Assuming R=2 k$\Omega$, a capacitance C of 100 pF is necessary. In the present invention shown in FIG. 9, on the other hand, the capacitance of capacitor C1 can be as small as 0.56 pF, when $I_2$=10 $\mu$A. Here, it is possible to decrease the capacitance of capacitor C1, by decreasing bias current $I_2$ in the comparator or the operational amplifier.

Embodiment 9

Figure 10:
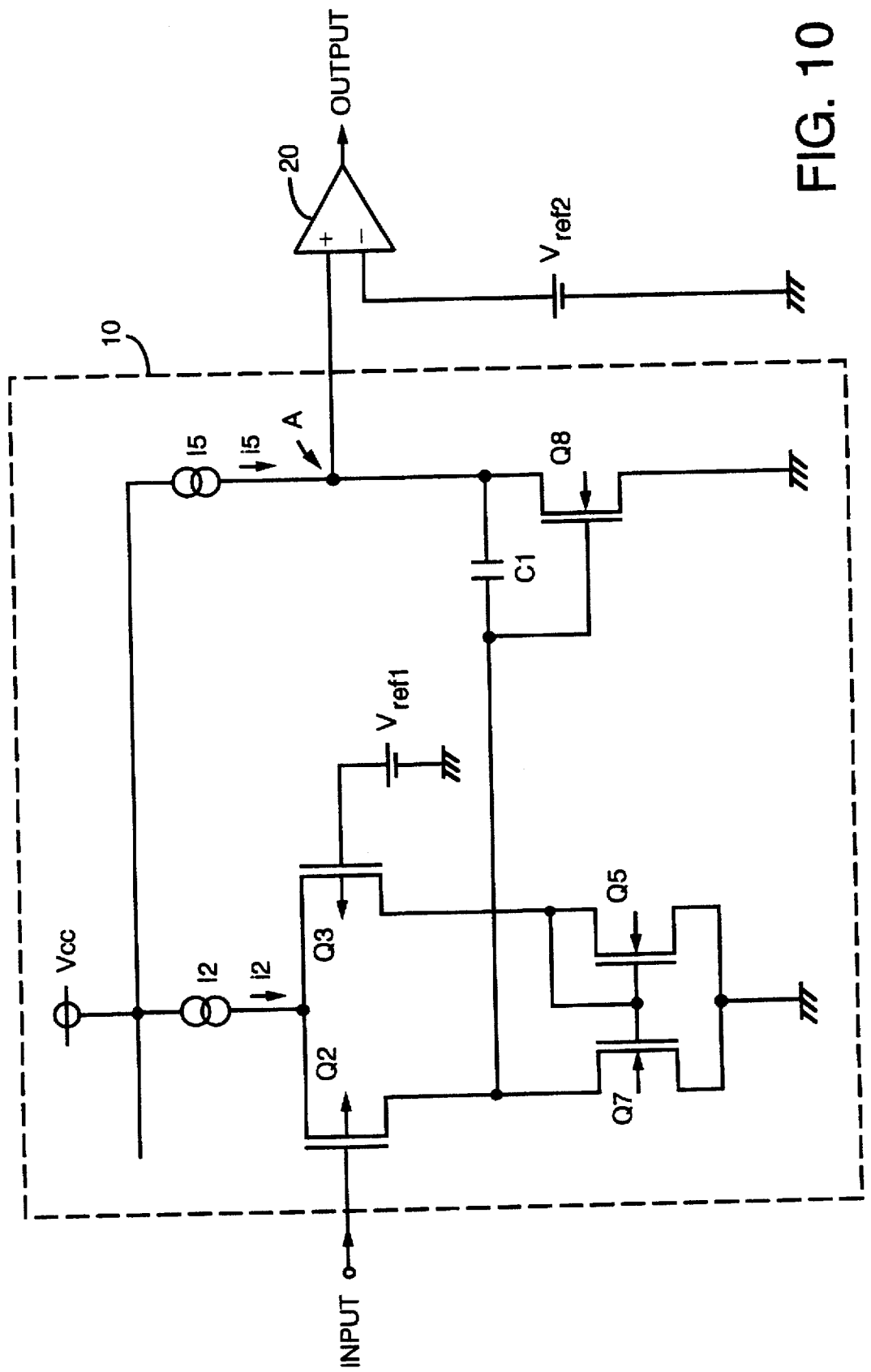
FIG. 10 shows a digital signal transfer circuit of a ninth embodiment of the present invention.

FIG. 10 shows a digital signal transfer circuit of a ninth embodiment of the present invention. The transistors used in the ninth embodiment are MOS transistors, while the transistors used in the eighth embodiment are bipolar transistors. In other words, in the ninth embodiment, PNP transistors Q2, Q3 of the eighth embodiment are replaced by P channel MOS transistors Q2, Q3, and NPN transistors Q5, Q7, and Q8 are replaced by N channel MOS transistors Q5, Q7, and Q8. Constant current source I2 and I5 also comprise MOS transistors as is generally known.

The circuit of such circuit configuration operates in the same way as shown in the eighth embodiment. The elements having the same reference numbers in FIG. 10, which shows the ninth embodiment, are the same portions or corresponding portions. The ninth embodiment has the same effects as those in FIG. 9 which shows the eighth embodiment.

Embodiment 10

Figure 11:
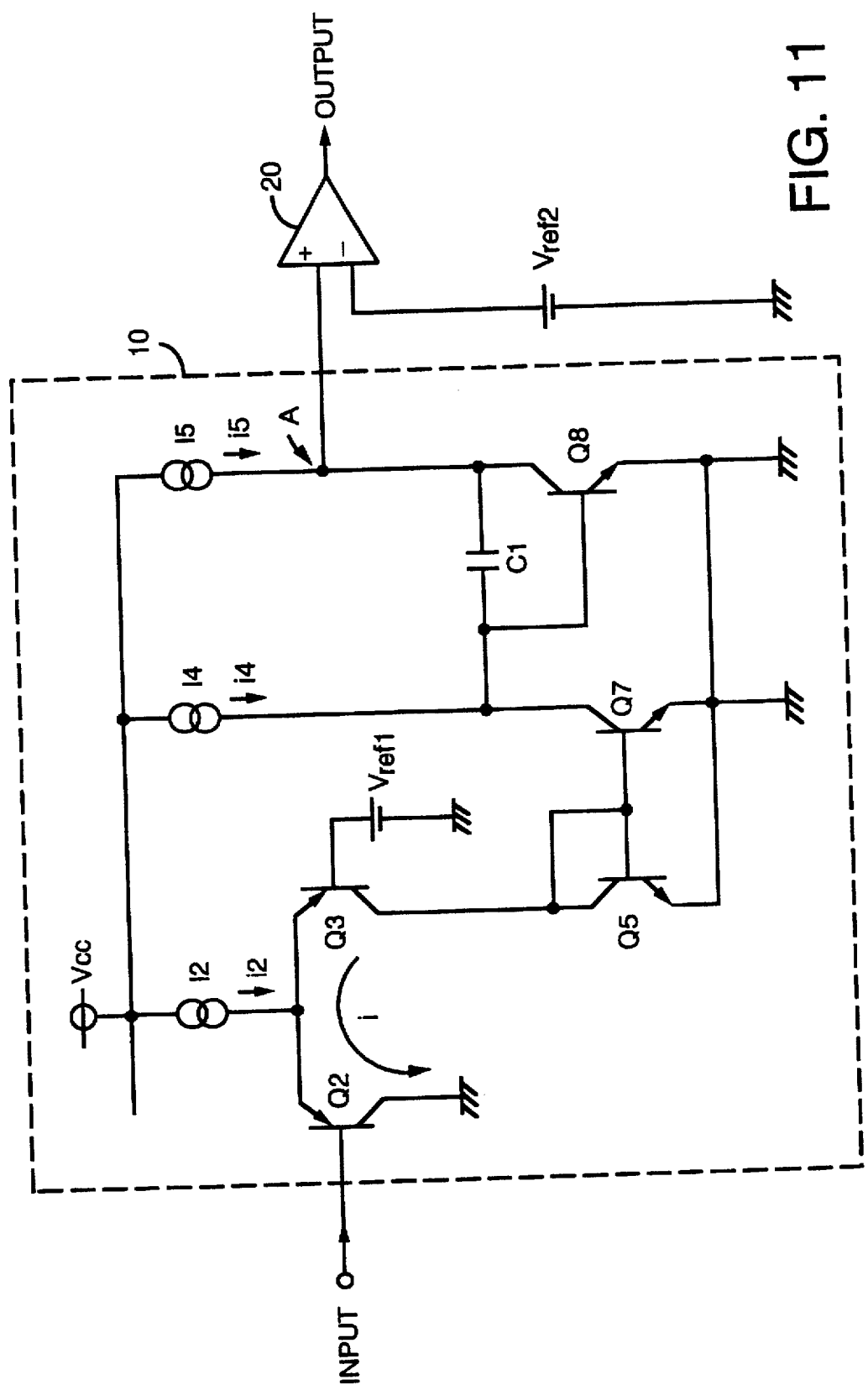
FIG. 11 shows a digital signal transfer circuit of a tenth embodiment of the present invention.

FIG. 11 shows a digital signal transfer circuit of a tenth embodiment of the present invention which is suitable for incorporation into in a semiconductor integrated circuit, and can transfer a signal by removing the noise superposed on the digital signal. This circuit of the tenth embodiment is different from that of the eighth embodiment only in the construction of operational amplifier 10.

In FIG. 11, a base of PNP transistor Q2 receives the input signal input into the non-inverting input terminal (+) and a its collector is grounded. A PNP transistor Q2 constitutes a differential pair of transistors combined with the PNP transistor Q3. A base of PNP transistor Q3 receives a first reference voltage (comparison voltage) $V_{ref1}$ at an inverting input terminal (–), and its emitter is connected to an emitter of the PNP transistor Q2, and its collector functions as an output node of the differential pair of transistors. Transistor Q3 has the same characteristic as the PNP transistor Q2, where the collector current (the output current of the differential pair of transistors) is the same as the collector current of PNP transistor Q2, when the potential applied to the base of PNP transistor Q3 is the same as that of PNP transistor Q2.

Constant current source I2 is connected between power supply potential Vcc and the commonly connected emitters of the PNP transistors Q2 and Q3, and provides constant current i2 to the emitters of the PNP transistors Q2 and Q3. This constant current source I2 comprises bipolar transistors as is generally known.

A collector of NPN transistor Q5 is connected to an output node of the differential pair of transistors, that is, the collector of PNP transistor Q3, and a base of the NPN transistor Q5 is connected to the emitter of the NPN transistor Q5, and its emitter is grounded. The base of the NPN transistor Q5 and the base of the NPN transistor Q7 are connected each other and comprise a current mirror circuit. NPN transistor Q5 functions as an input side transistor of the current mirror circuit.

NPN transistor Q7 functions as an output side transistor of the current mirror circuit, its emitter is grounded, and its collector functions as an output node of the current mirror circuit. A collector current ratio between the collector currents of the NPN transistor Q5, Q7 is n:1. In other words, collector current of NPN transistor Q7 is 1/n times of the collector current of NPN transistor Q5.

Constant current source I4 is connected between the power supply potential node Vcc and the collector of the NPN transistor Q7, and provides constant current i4 to the collector of the NPN transistor Q7. Constant current source I4 comprises bipolar transistors as is generally known, and constant current i4 is 1/2n times constant current i2.

A base of NPN transistor Q8 is connected to the output node of the current mirror circuit, that is, the collector of the NPN transistor Q7, a collector of Q8 is connected to the output node A, an emitter of Q8 is grounded, and Q8 functions as an output transistor. Constant current source I5 is connected between the power supply potential node Vcc and the collector of transistor Q8, and provides constant current i5 for the collector of the NPN transistor Q8. Constant current source I5 comprises bipolar transistors as is generally known.

Capacitive element C1 is connected between the output node of the current mirror circuit, that is, the collector of NPN transistor Q7, and the output node A, that is, the collector of the NPN transistor Q8.

An operation of the circuit of such circuit configuration is explained as follows. When a low digital signal is input into the non-inverting terminal as an input signal, the operational amplifier 10 compares the high digital signals with first reference voltage $V_{ref1}$, and outputs the low digital signals to the output node A when the input signal of the base of transistor Q2 is higher than first reference voltage $V_{ref1}$. Since the low potential is provided to the PNP transistor Q2, while first reference voltage $V_{ref1}$ which is higher than the low potential is provided, PNP transistor Q2 is in the conductive state, while PNP transistor Q3 is in the non-conductive state. Therefore, a collector current does not flow in the PNP transistor Q3, which means that no collector current flows in the NPN transistors Q5 and Q7.

As a result, constant current i4 (=i2/2n) of constant current source I4 flows in the base of NPN transistor Q8 and capacitive element C1. At this time, the constant current i4 functions as a charging current of capacitive element C1, which determines the through-rate from low to high.

Therefore, the conductivity of NPN transistor Q8 is high (low as a resistance), which decreases the potential of output node A, and pulls the current from the output node A. As a result, the output node A becomes low. Receiving the low digital signal from the output node A at non-inverting input terminal (+), the comparator 20 compares the voltage of the low potential at non-inverting input terminal (+) with second reference voltage $V_{ref2}$ at inverting input terminal (–), and outputs the low digital signal.

When the high digital signal is input into the non-inverting terminal as the input signal, on the other hand, the operational amplifier 10 compares the low digital signal at the base of transistor Q2 with first reference voltage $V_{ref1}$, and eventually outputs the high digital signal to the output node A, when the input signal of transistor Q2 is lower than first reference voltage $V_{ref1}$.

Since the low potential is provided to the base of the PNP transistor Q2, while the first reference voltage $V_{ref1}$ which is lower than high potential is provided to the base of PNP transistor Q3, PNP transistor Q2 is in the non-conductive state, while PNP transistor Q3 is in the conductive state. Therefore, the constant current i2 flows from the collector of PNP transistor Q3.

Since the collector current of PNP transistor Q3 is the same as that of NPN transistor Q5, the collector current of NPN transistor Q7 is 1/n times of the collector current of PNP transistor Q3, that is i2×1/n.

As a result, the collector current of i2×1/2n of NPN transistor Q7 is pulled from the base of NPN transistor Q8 and capacitive element C1. This differential current i2×1/2n is a discharge current of capacitive element C1, which determines the through-rate from high to low.

Therefore, the conductivity of NPN transistor Q8 is low (high as a resistance, it can be in the non-conductive state), which increases the potential of output node A, and the current flows out of output node A. As a result, the potential of the output node A becomes high.

Receiving the high digital signal from output node A at non-inverting input terminal (+), the comparator 20 compares the voltage of the digital signal with the second reference voltage $V_{ref2}$, which is lower than the high potential received at inverting input terminal (−), and outputs the high digital signal, according to the input signal.

When the input signal at the non-inverting terminal changes from low to high, the base potential of transistor Q2 which changes from low to high is compared with first reference voltage Vref1, and turns PNP transistor Q2 from the conductive state to a non-conductive state, and turns PNP transistor Q3 from a non-conductive state to a conductive state, according to the potential change of the input signal. As a result, NPN transistor Q7 pulls the current i2/2n from the base of NPN transistor Q8 and capacitive element C1.

Therefore, the conductivity of NPN transistor Q8 is low (high as a resistance, and it can be in the non-conductive state), which increases the potential of output node A, and the current flows out of the output node A. Therefore, the amplifier outputs the output signals, which change from low to high, having the predetermined through-rate (which depends on the discharge time of capacitive element C1), to output node A, and the potential of the output node A finally becomes high.

When the output of operational amplifier 10 changes from low to high and reaches the reference voltage $V_{ref2}$, the comparator 20 instantly raises the output potential from low to high, and the high digital signal is output.

On the other hand, when the input signal at the non-inverting terminal changes from high to low, the base potential of transistor Q2 which changes from high to low is compared with first reference voltage Vref1, and turns PNP transistor Q2 from the non-conductive state to a conductive state, and turns PNP transistor Q3 from a conductive state to a non-conductive state, according to the potential change of the input signal. As a result, the current i2/2n flows into the base of NPN transistor Q8 and capacitive element C1.

Therefore, the conductivity of transistor Q8 is high (low as a resistance), which decreases the potential of output node A, and the current is pulled from the output node A. As a result, operational amplifier 10 outputs the output signal, which has a predetermined through-rate (which depends on charge time of capacitive element C1) and changes from high to low, to the output node A, and therefore the output node A finally becomes low.

When the output of operational amplifier 10 changes from high to low and reaches the reference voltage $V_{ref2}$, the comparator 20 suddenly decreases the output potential from high to low, and therefore the amplifier outputs the low digital signal.

When the input signal changes from high to low, the emitter potential of PNP transistor Q2 in operational amplifier 10 drops temporally, the reverse bias is applied to the base-emitter of PNP transistor Q3, and the reverse-biased current caused by PNP transistor Q3 flows to the ground node via PNP transistor Q2. As a result, this reverse-biased current does not affect NPN transistor Q8, and the output of operational amplifier 10 changes from high to low, according to the input signal change from high to low.

Since operational amplifier 10 has the predetermined through-rate, even when the noise turning to low is superposed on the high input signal, or when the noise turning to high is superposed on the low input signal, the noise does not affect the output of operational amplifier 10, if the noise frequency is higher than the predetermined value. Furthermore, since the collector of PNP transistor Q2, to which the input signal is input and which constitutes one side of the differential pair of transistors, is grounded, and the collector of PNP transistor Q3 functions as an output node of the differential pair of transistors, the effect of the reverse-biased current on PNP transistor Q3 can be suppressed in case that the input signal at the non-inverting terminal changes from high to low, the noise is thoroughly removed. Moreover, even when the output of operational amplifier 10 changes to some extent, the output from comparator 20 is not influenced by noise, if the output of the operational amplifier 10 does not drop lower than the reference voltage $V_{ref2}$.

Therefore, it is possible to obtain a digital signal transfer circuit which is suitable for incorporation into a semiconductor integrated circuit, which can transfer the signal by removing the noise superposed on the input digital signal.

Figures 14A, 14B, 14C:
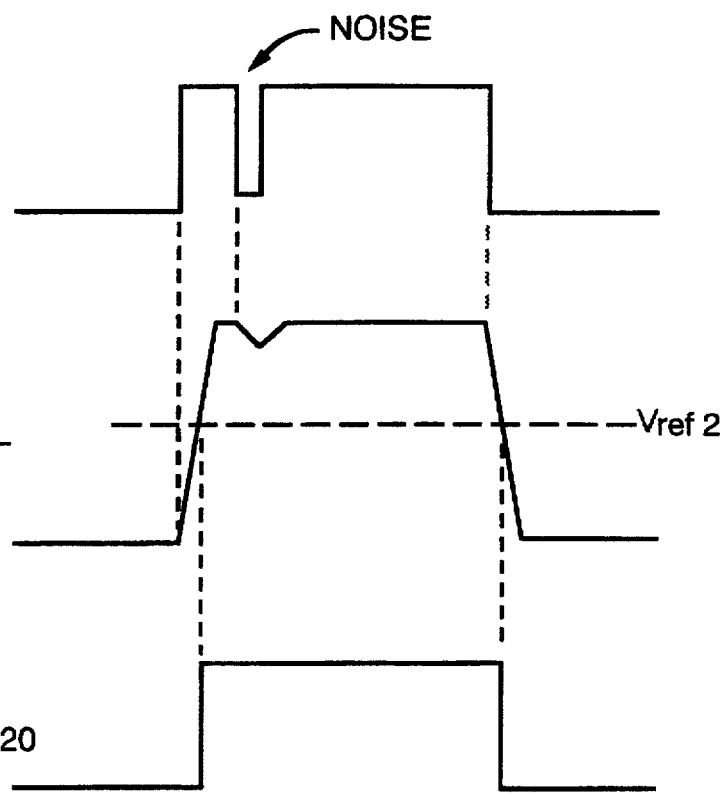
FIGS. 14(a)–14(c) show timing charts indicating an input-output relation of an operational amplifier when pulse type noise is input into the circuit shown in FIG. 9.

The method of removing the superposed noise which turns to low when the input signal is high is explained in &tail, using FIG. 14A and FIG. 14B. If the noise which turns to low is applied when the input signal is high as shown in FIG. 14A, the output of operational amplifier 10 having the predetermined through-rate changes from high to low in response to the input signal change from high to low. After then, when the noise of the input signal changes from low to high as shown in FIG. 14B, the output of operational amplifier 10, having the predetermined through-rate, turns to high.

At this width, the relationship between the pulse time of the noise and voltage dip V of the output of operational amplifier 10 is obtained as follows.

$$C1 \times V = i4 \times t$$

Assuming that i4=10 μA, C1=10 pF, t=10 ns, then voltage dip V becomes 0.01 V. Therefore, it is remarkably easy to define second reference voltage $V_{ref2}$. And the output signal of comparator 20 is not influenced by the noise-removed, unless the potential of the output of operational amplifier 10 change becomes lower than the second reference voltage $V_{ref2}$, that is, an output signal in which the noise is removed is obtained.

In operational amplifier 10, the cut-off frequency of the noise is obtained by the same formula as explained in the first embodiment. The rising time from low to high and the fall time from high to low can be set by constant current i2 of constant current source I2 and constant current i4 of constant current source I4. In the ninth embodiment, the rise time and the fall time are made equal by setting the current such as i4=2×i2.

By increasing the n of current mirror ratio n:1 between transistors Q5 and Q7 which constitute the current mirror circuit, it is possible to increase the constant current i2 of constant current source I2, and to increase the switching speed of PNP transistors Q1, Q2, Q3, and Q6 to be higher than the through-rate, if constant current i4 of constant current source I4 is decreased and also the cut-off frequency is lowered.

Embodiment 11

Figure 12:
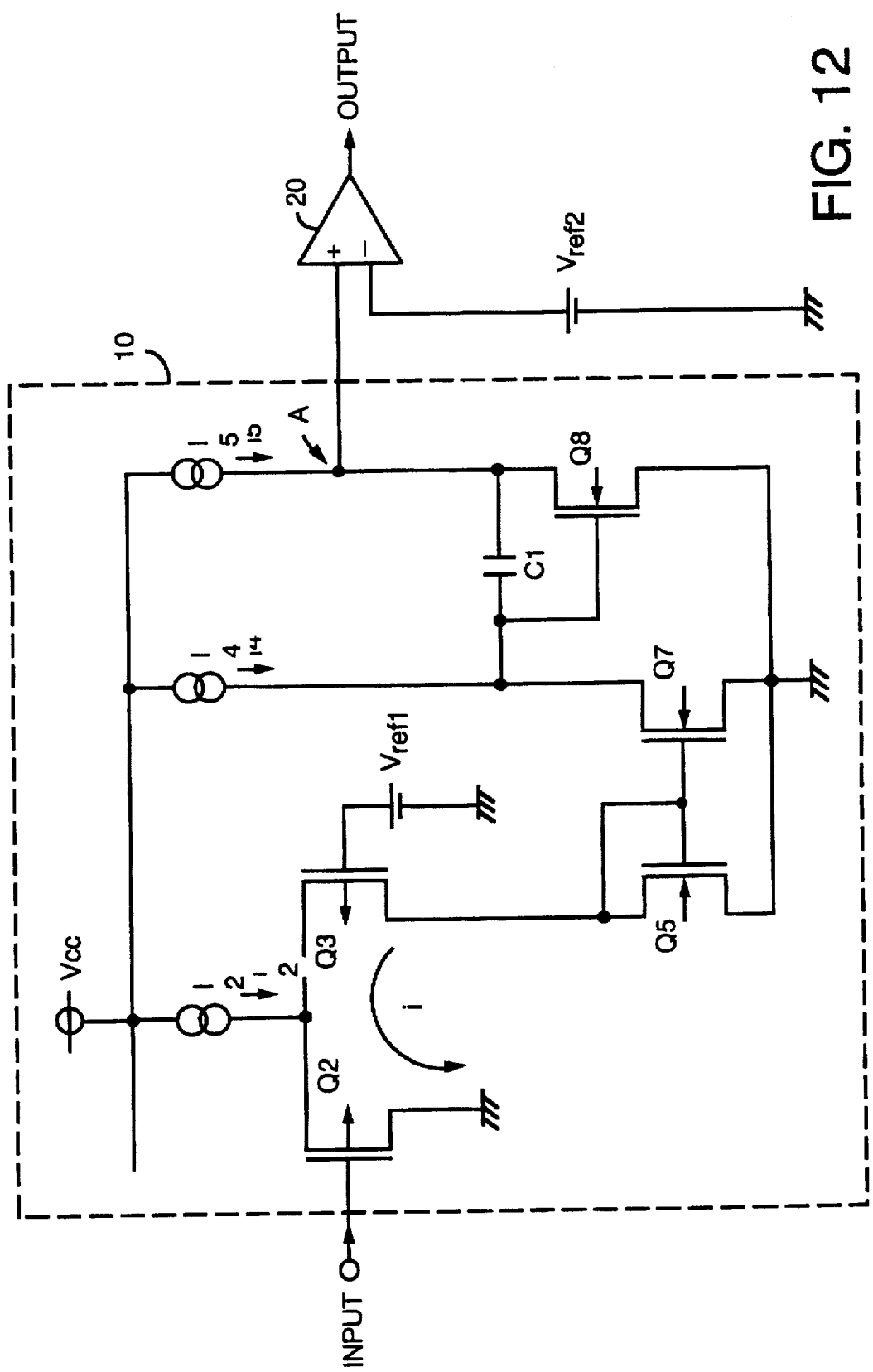
FIG. 12 shows a digital signal transfer circuit of an eleventh embodiment of the present invention.
Figure 13:
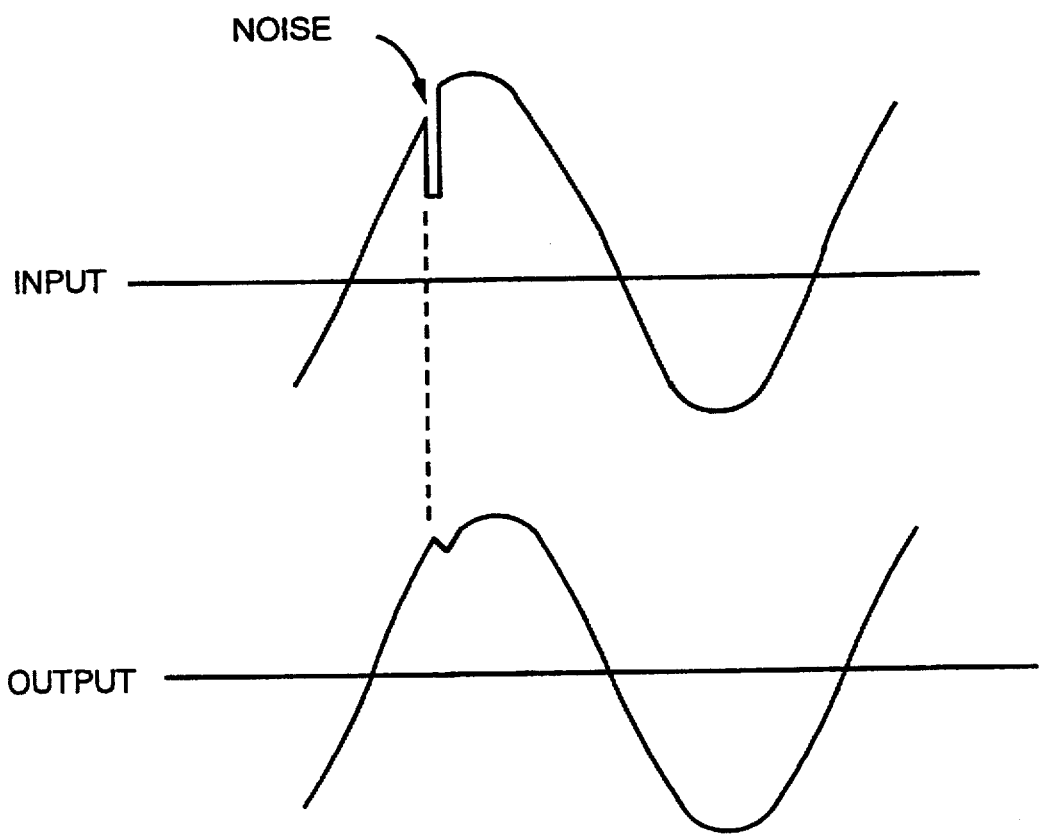
FIG. 13 shows a timing chart indicating an input-output relation of an operational amplifier when pulse type noise is input into the circuit shown in FIG. 1.

FIG. 12 shows a circuit of an eleventh embodiment of the present invention. This circuit of the eleventh embodiment is different from the view point that the tenth embodiment comprises bipolar transistors, but the eleventh embodiment comprises MOS transistors. In other words, NPN transistors Q5, Q7, and Q8 of the tenth embodiment are replaced by N channel MOS transistors Q5, Q7, and Q8 in the eleventh embodiment. In the same way, constant current sources I2, I4, and I5 comprise MOS transistors in the present embodiment, as is generally known.

The circuit of such circuit configuration operates in the same way as that of the eighth embodiment. Here, the elements having the same reference numbers in FIG. 12 which shows the eleventh embodiment are the same portions or the corresponding portions having the same functions as those in FIG. 11 which shows the tenth embodiment.

What is claimed is:

1. An operational amplifier comprising:

a differential pair of transistors comprising a first transistor of a first polarity type having a control electrode receiving an input signal, a first electrode connected to a first power supply potential node, and a second electrode, and a second transistor of the first polarity type having a control electrode, a second electrode connected to the second electrode of said first transistor, and a first electrode as an output node of said differential pair of transistors;

a current mirror circuit comprising a third transistor of a second polarity type having a first electrode and a control electrode connected to said output node of said differential pair of transistors, and a fourth transistor of the second polarity type having a control electrode connected to said control electrode of said third transistor, a second electrode coupled to the first power supply potential node, and a first electrode as an output node of said current mirror circuit;

a fifth transistor of the second polarity type having a first electrode connected to an output terminal, a second electrode coupled to the first power supply potential node, and a control electrode connected to said output node of said current mirror circuit; and a capacitive element connected between said output node of said current mirror circuit and said output terminal.

2. The operational amplifier of claim 1 comprising:

a sixth transistor of the first polarity type having a first control electrode receiving the input signal, a first electrode coupled to the first power supply potential node, and a second electrode connected to said control electrode of said first transistor; and a seventh transistor the first polarity type having a control electrode connected to said output terminal, a first electrode coupled to the first power supply potential node, and a second control electrode connected to said control electrode of said second transistor.

3. The operational amplifier of claim 2 wherein said first, second, sixth, and seventh transistors are PNP transistors, said third to fifth transistors are NPN transistors, said first electrodes are collector electrodes, said second electrodes are emitter electrodes, and said control electrodes are base electrodes, and the first power supply potential node is a ground node.

4. The operational amplifier of claim 1 wherein said first and second transistors are PNP transistors, said third to fifth transistors are NPN transistors, said first electrodes are collector electrodes, said second electrodes are emitter electrodes, and said control electrodes are base electrodes, and the first power supply potential node is a ground node.

5. The operational amplifier of claim 1 wherein said first and second transistors are NPN transistors, said third to fifth transistors are PNP transistors, said first electrodes are collector electrodes, said second electrodes are emitter electrodes, and said control electrodes are base electrodes, and a power supply potential is applied to the first power supply potential node.

6. The operational amplifier of claim 1 wherein:

said first and second transistors are P channel MOS transistors in which said first electrodes are drain electrodes, said second electrodes are source electrodes, and said control electrodes are gate electrodes;

said third to fifth transistors are N channel MOS transistors in which said first electrodes are drain electrodes, said second electrodes are source electrodes, and said control electrodes are gate electrodes; and the first power supply potential node is a ground node.

7. The operational amplifier of claim 1 wherein:

said first and second transistors are N channel MOS transistors in which said first electrodes are drain electrodes, said second electrodes are source electrodes, and said control electrodes are gate electrodes;

said third to fifth transistors are P channel MOS transistors in which said first electrodes are drain electrodes, said second electrodes are source electrodes, and said control electrodes are gate electrodes; and the first power supply potential node is a ground node.

8. The operational amplifier of claim 7 wherein said first and second transistors are multi-collector transistors.

9. The operational amplifier of claim 1 wherein:

said first transistor has a plurality of first electrodes each of which is connected to said first power supply potential node; and said second transistor has a plurality of first electrodes, one of which functions as said output node of said differential pair of transistors and others of which are connected to the first power supply potential node.

10. The operational amplifier of claim 1 wherein said current mirror circuit has a ratio 1/n (n>1) of input current to output current.

11. A digital signal transfer circuit comprising;

an operational amplifier having a non-inverting input for receiving a digital input signal and including;

a differential pair of transistors comprising a first transistor of a first polarity type having a control electrode connected to said non-inverting input, a first electrode connected to a first power supply potential node, and a second electrode, and a second transistor of the first polarity type having a control electrode receiving a reference voltage, a second electrode connected to said second electrode of said first transistor, and a first electrode functioning as an output node of said differential pair of transistors;

a current mirror circuit comprising a third transistor of a second polarity type having a first electrode and a control electrode connected to said output node of said differential pair of transistors, and a second electrode connected to the first power supply potential node, and a fourth transistor of the second polarity type having a control electrode connected to said control electrode of said third transistor, a second electrode connected to the first power supply potential node, and a first electrode functioning as an output node of said current mirror circuit;

a fifth transistor of the second polarity type having a first electrode connected to an output terminal, a second electrode connected to the first power supply potential node, and a control electrode connected to said output node of said current mirror circuit; and a capacitive element connected between said output node of said current mirror circuit and said output terminal; and a comparator having a non-inverting input for receiving an output signal of said operational amplifier and an inverting input for receiving a reference voltage.

12. The digital signal transfer circuit of claim 11 wherein said first and second transistors are PNP transistors, said third to fifth transistors are NPN transistors, said first electrodes are collector electrodes, said second electrodes are emitter electrodes, and said control electrodes are base electrodes, and the first power supply potential node is a ground node.

13. The operational amplifier of claim 11 wherein:

said first and second transistors are P channel MOS transistors in which said first electrodes are drain electrodes, said second electrodes are source electrodes, and said control electrodes are gate electrodes;

said third to fifth transistors are N channel MOS transistors in which said first electrodes are drain electrodes, said second electrodes are source electrodes, and said control electrodes are gate electrodes; and the first power supply potential node is a ground node.

* * * * *

UNITED STATES PATENT AND TRADEMARK OFFICE
CERTIFICATE OF CORRECTION

PATENT NO. : 5,719,529
DATED : February 17, 1998
INVENTOR(S) : Kawahara et al.

It is certified that error appears in the above-identified patent and that said Letters Patent is hereby corrected as shown below: On the title page;

Item 30, (Foreign Application Priority Data) insert the following:

-- October 31, 1995 [JP] Japan ............... 7-283673 --.

Signed and Sealed this

Seventeenth Day of November, 1998

Attest:

BRUCE LEHMAN

Attesting Officer

Commissioner of Patents and Trademarks